(12) United States Patent  
Zimmerman et al.

(10) Patent No.: US 9,171,909 B2  
(45) Date of Patent: Oct. 27, 2015

(54) FLEXIBLE SEMICONDUCTOR DEVICES BASED ON FLEXIBLE FREESTANDING EPITAXIAL ELEMENTS

(71) Applicants: Scott M. Zimmerman, Basking Ridge, NJ (US); Karl W. Beeson, Princeton, NJ (US); William R. Livesay, San Diego, CA (US); Richard L. Ross, Del Mar, CA (US)

(72) Inventors: Scott M. Zimmerman, Basking Ridge, NJ (US); Karl W. Beeson, Princeton, NJ (US); William R. Livesay, San Diego, CA (US); Richard L. Ross, Del Mar, CA (US)

(73) Assignee: Goldeneye, Inc., San Diego, CA (US)

( * ) Notice: Subject to any disclaimer, the term of this patent is extended or adjusted under 35 U.S.C. 154(b) by 0 days.

(21) Appl. No.: 14/159,430

(22) Filed: Jan. 20, 2014

(65) Prior Publication Data

US 2014/0319533 A1      Oct. 30, 2014

Related U.S. Application Data

(63) Continuation-in-part of application No. 12/462,295, filed on Jul. 31, 2009, now Pat. No. 8,633,493.

(60) Provisional application No. 61/188,115, filed on Aug. 4, 2008.

(51) Int. Cl.
| | |
|---|---|
| *H01L 29/20* | (2006.01) |
| *H01L 21/20* | (2006.01) |
| *H01L 31/0392* | (2006.01) |
| *H01L 31/18* | (2006.01) |
| *H01L 33/32* | (2010.01) |
| *C30B 25/18* | (2006.01) |
| *H01L 33/00* | (2010.01) |

(52) U.S. Cl.
CPC ............ *H01L 29/2003* (2013.01); *C30B 25/18* (2013.01); *H01L 21/2007* (2013.01); *H01L 31/0392* (2013.01); *H01L 31/1836* (2013.01); *H01L 31/1852* (2013.01); *H01L 33/32* (2013.01); *H01L 33/007* (2013.01); *Y02E 10/544* (2013.01)

(58) Field of Classification Search
CPC ................... H01L 21/02521; H01L 21/02488; H01L 21/02425; H01L 21/02439; H01L 31/0392; H01L 31/1892; H01L 21/0254; H01L 33/007; H01L 33/0075; H01L 21/0243; H01L 31/18
USPC ...................................... 257/11, 76
See application file for complete search history.

(56) References Cited

U.S. PATENT DOCUMENTS

| | | |
|---|---|---|
| 4,456,490 A | 6/1984 | Dutta et al. |
| 5,679,152 A | 10/1997 | Tischler et al. |

(Continued)

*Primary Examiner* — Roy Potter  
(74) *Attorney, Agent, or Firm* — William Propp, Esq.

(57) ABSTRACT

Flexible semiconductor devices based on flexible freestanding epitaxial elements are disclosed. The flexible freestanding epitaxial elements provide a virgin as grown epitaxy ready surface for additional growth layers. These flexible semiconductor devices have reduced stress due to the ability to flex with a radius of curvature less than 100 meters. Low radius of curvature flexing enables higher quality epitaxial growth and enables 3D device structures. Uniformity of layer formation is maintained by direct absorption of actinic radiation by the flexible freestanding epitaxial element within a reactor. In addition, standard post processing steps like lithography are enabled by the ability of the devices and elements to be flattened using a secondary support element or vacuum. Finished flexible semiconductor devices can be flexed to a radius of curvature of less than 100 meters. Nitrides, Zinc Oxides, and their alloys are preferred materials for the flexible freestanding epitaxial elements.

24 Claims, 50 Drawing Sheets

(56) References Cited

U.S. PATENT DOCUMENTS

| | | |
|---|---|---|
| 6,284,384 B1 * | 9/2001 | Wilson et al. .................. 428/450 |
| 6,924,159 B2 | 8/2005 | Usui et al. |
| 7,282,381 B2 | 10/2007 | Feltin et al. |
| 7,727,790 B2 | 6/2010 | Zimmerman et al. |
| 8,017,415 B2 | 9/2011 | Zimmerman et al. |
| 2006/0226414 A1 * | 10/2006 | Oshima ........................... 257/11 |
| 2007/0116972 A1 | 5/2007 | Persky |
| 2008/0182353 A1 | 7/2008 | Zimmerman et al. |
| 2008/0248259 A1 | 10/2008 | Lee et al. |
| 2008/0258165 A1 | 10/2008 | Zimmerman et al. |
| 2013/0143917 A1 | 6/2013 | He et al. |

* cited by examiner

FLEXIBLE SEMICONDUCTOR DEVICES BASED ON FLEXIBLE FREESTANDING EPITAXIAL ELEMENTS

REFERENCE TO PRIOR APPLICATION

This application is a continuation of U.S. application Ser. No. 12/462,295 filed Jul. 31, 2009 which claims the benefit of U.S. Provisional Patent Application Ser. No. 61/188,115, which was filed on Aug. 4, 2008, all commonly assigned as the present application and herein incorporated by reference.

BACKGROUND OF THE INVENTION

Flexible semiconductor devices offer several advantages over more conventional wafer based semiconductor devices for mobile devices, wearable devices, and lower cost devices. Flexibility is usually defined by the radius of curvature in kilometers that the flexible semiconductor device can be flexed to. In general, flexible semiconductor devices in the prior art are formed in a wafer state and then either removed from a growth substrate, thinned, or otherwise separated from a rigid element. While this allows for processing using standard semiconductor wafer based lithography or patterning equipment tool sets, a critical benefit of flexibility is lost using this approach. This invention discloses flexible semiconductor devices grown on flexible epitaxial elements whereby improved device performance is realized from the flexible stress free nature of the growth substrate or epitaxial element and the presence of a virgin as grown epitaxy ready surface.

Nitrides and zinc oxides and their alloys in particular offer a unique range of properties compared to other semiconducting materials like silicon and silicon carbide. Wide band gap materials like gallium nitride (GaN), aluminum gallium nitride (AlGaN), and aluminum nitride (AlN) are finding applications in high frequency devices, high power devices, LEDs, optoelectronics, bio-technology, and high efficiency electronics. The opportunity exists for integration of these devices into single layered and multi-layered devices. Nitrides and zinc oxides and their alloys offer a unique mix of optical transparency through the visible and UV spectrum, high thermal conductivity, chemical resistance, piezoelectric properties, laseability, bio-compatibility and high frequency capability. Like nitrides and zinc oxides, diamond and other high bandgap materials are difficult to make into wafer form. By harvesting epitaxial elements of these high bandgap materials the benefits of bulk wafers can be realized at a fraction of the cost and without the need for expensive and defect prone steps like slicing and polishing.

The use of nitrides and zinc oxides and their alloys in most applications has been limited by the lack of low cost high crystal quality native substrate material. Nitrides and zinc oxides and their alloys have proven difficult to grow economically in high quality single crystal form due to the high temperatures and narrow growth conditions. While this work may eventually yield low defect density material, the cost of those materials will be inherently high.

Forrest in U.S. Patent Publications No. 2011016910, "Methods of preparing flexible photovoltaic devices using epitaxial liftoff, and preserving the integrity of growth substrates used in epitaxial growth" discloses methods to remove epitaxial devices to form flexible solar cells via liftoff. Like most flexible approaches this disclosure removes the epitaxial layer after device growth. The epitaxial stresses are higher than when the devices are formed, grown, or otherwise deposited directly on a flexible growth substrate. In addition, the device performance is typically compromised when the growth substrate is removed or at least different. As an example, the emission wavelength of an MQW LED is typically different on the growth substrate than when it is transferred via wafer bonding to another device substrate. This can lead to increased binning requirements and yield issues.

Lee in U.S. Patent Publications No. 2008 0248259 "Gallium Nitride/Sapphire thin epitaxial element having reduced bending deformation" discloses a method for creating a GaN on sapphire growth substrate with a reduced radius of curvature. The goal of Lees filing was to increase the radius of curvature to 1 kilometer or higher. In general flat wafers are preferred for uniformity and subsequent lithographic and processing steps. However, the radius of curvature changes for any non-homogenous material as a function of temperature due to the mismatch in the thermal expansion coefficients. A flat growth substrate at room temperature may have a radius of curvature less than 1 kilometer at 1000° C. growth temperatures or vice versa. So, while a low stress layer may be grown at the growth temperature, once cooled to room temperature very high stresses may be imparted to the layer. Even a native growth substrate will only exactly match those layers which match the growth substrates exact composition. All wide band gap materials require high temperature growth processes so there may be over 1000° C. difference between growth temperature and operational temperature for a device. The authors of this filing have shown that flexible freestanding single crystal epitaxial elements can reduce epitaxial stresses because they are flexible and can deform to alleviate stresses. They also can be forced flat for post processing steps like lithography etc. As shown in Lee slight changes in the radius of curvature can translate into very large changes in stress levels. The need exist for methods to eliminate stress due to thermal expansion mismatch.

Romano in U.S. Patent Application 20130143917 discloses the growth of InGaN layers for JFET's. It is claimed that $10^4$ to $10^5$ dislocations per cm2 are required to grow InGaN with greater than 20% Indium content. Bulk GaN with such low dislocation density requires the use of thick GaN growth (greater than 1 mm) which is both expensive and difficult to produce. The need exists for a low cost method of obtaining high quality InGaN with greater than 20% indium content without having to resort to thick bulk GaN wafers.

Zimmerman in U.S. Pat. No. 8,017,415 discloses methods for forming devices on the freestanding nitride foils disclosed in this filing on both sides of the foils. These foils are typically 30 to 50 microns thick harvested from sapphire templates using the technique disclosed in Zimmerman U.S. Pat. No. 7,727,790. Unlike conventional laser liftoff this approach allows for removal of large area foils without the need to touch or otherwise modify the as grown virgin epitaxial ready surface of the foil. This overcomes the surface, polish, and miscut angle defects associated with bulk GaN wafers. The intent of this invention is to disclose flexible semiconductor devices formed based on flexible freestanding nitride and zinc oxide and their alloys.

It is critical that any growth substrate exhibit an epitaxy ready surface for there to be quality additional epitaxial layer growth. Silicon has dominated the semiconductor market due to the ease of forming high quality wafers with epitaxial quality surfaces with a uniform crystal plane across the entire wafer. Unlike silicon, nitrides do not easily polish and are very difficult to grow such that a single crystal plane is presented across the entire growth surface within any one plane. The warpage and stresses experienced during bulk crystal growth means that when the bulk material is sliced into wafers the crystal orientation varies across any planar surface. Growth rates of subsequent epitaxial layers are directly related to crystal plane orientation. The need therefore exists for a low cost nitride and zinc oxide, and their alloys, growth substrate in the form of foils, tapes, or ribbons which has an as grown epitaxy ready surface for subsequent device growth.

SiC, Silicon, Glass, Sapphire, and a variety of other growth substrates have been used to grow nitride devices. Each has some drawback compared to native substrates. Of the list above SiC is probably one of the better thermal matches but is limited to less than 6 inches in diameter and is expensive to manufacture. In addition, doped SiC is optically absorptive in the blue region making doped SiC unsuitable for vertical blue LED devices. As such undoped SiC is used which then requires lateral devices which suffer from current spreading and higher Vf (forward voltage) performance. Silicon is reactive with nitrides and Si is the major n type dopant. Care must be taken to prevent poisoning of p type material. Glass requires lower growth temperatures and suffers from many other issues. Sapphire is the dominate growth substrate in the LED industry. It is however a dielectric and therefore most devices are lateral devices or the nitride must be removed to create a vertical device. Significant stresses are introduced into the nitride layer when sapphire is the growth substrate. The need exists for methods and substrates which mitigate the stresses from subsequent epitaxial growths.

Semiconductor devices are used in a wide variety of applications. Silicon has been used as the substrate material of choice due to cost and availability of single crystal silicon wafers. Driven by the microelectronic industry, silicon wafer production has enabled the economical use of larger wafers with greater than 12 inch diameters. The low cost of silicon allows thick (1-2 mm) single crystal silicon wafers to be used without a secondary substrate for handling and processing. This enables the formation of large area die, which can be processed without the need for transfer substrates or wafer bonding. Additionally, the properties of silicon permit wafers to be doped so that 3 dimensional devices (via planar processing) can be created taking advantage of the wafer conductivity. For some devices it is desirable to utilize thinning techniques to reduce the overall thickness of the silicon to tens of microns to improve thermal performance. Although silicon has been the dominant material for most microelectronic applications there are other materials, which have desirable properties and advantages over silicon in the areas of optoelectronics, solar cells and power devices. However, heretofore there has not been an economical solution to using these materials without growing them or attaching them to secondary substrates.

Silicon also has limitations with regard to operating temperature as well as other critical material parameters; this limits silicon's usefulness in optical, power and high-frequency applications. Nitride alloys and oxide alloys have several properties, which are superior to silicon ranging from higher thermal conductivity to biocompatibility. Unfortunately, nitrides are not available in wafer form at a reasonable price or reasonable quality. Even if such wafers were to become available, costly growth, dicing, and thinning techniques would be required to create useful devices. In most cases, devices with an overall thickness between 20 and 150 microns are desired from a thermal impedance, packaging, and optical efficiency standpoint. As such, epitaxial element based processing offers several advantages over bulk wafer approaches. As the solar industry has discovered epitaxial element and foil based processing is much more cost effective than wafer based approaches if high resolution lithography is not required. The need exists for cost effective thin nitride epitaxial elements, but also for the ability to process both sides of these epitaxial elements for the formation of waveguides, edge emitters, and symmetric device structures.

While wafers offer significant advantages to high-resolution circuitry as used in microprocessors and memory devices, which require up to 50 masking steps, many applications do not require high-resolution lithography steps. In some cases, processing round wafers is actually a disadvantage or limitation to be overcome. As an example, solar cells are made in ribbon and large area formats. Alternately, liquid crystal displays contain semiconducting active-matrix backplanes and are grown on large glass plates that measure four to 6 feet in dimension. Unlike the semiconductor industry, the thick epitaxial element industry tends to use square substrates, which are more compatible with the printing techniques typically used to form patterned conductors and dielectrics. Square, ribbon and tape based substrates have less edge loss than yields on round wafers. The need exists for non-wafer forms of nitrides to reduce not only costs but to increase material utilization.

In the case of wafer bonded epitaxial elements, stresses created during the original growth process are transferred via the wafer bonding process. Also the resulting structure suffers from poor thermal performance, thermal expansion mismatch which limits operating range. Typically these flexible freestanding epitaxial elements are thin (1 to 3 microns) which can impact packaging processes such as wire bonding to electrical contacts on the device. This is due to the fragile nature of the thin nitride film, requiring reduced bonding forces to prevent cracking of the nitride layer. This lowers yield in final device fabrication. The lower permissible operating temperature range due to the use of secondary substrates used in wafer bonding not only limits device operation but also prevents the use of robust materials such as glass frits and fired contacts that can enhance packaging reliability but require high temperature processing. The need exists for methods and materials which eliminate the need for wafer bonding while still providing handleability and high temperature packaging techniques.

With these prior art methods, nitride epitaxial elements left on their growth substrate must be thin to prevent bowing either at room temperature or at high temperature growth conditions. The low thermal conductivity of sapphire in particular limits device performance and also typically requires wafer thinning processes, which increase costs. Also, the inability to create a vertical structure for non-conductive growth substrates like sapphire limit the ability to form vertical structures or stack nitride epitaxial elements, which can result in new and novel devices. The need exists for an epitaxial element which can be a freestanding nitride growth substrate that is compatible with vertical device designs.

Another prior art technique to form an epitaxial element that is a freestanding nitride substrate is to grow thick nitride layers on non-native growth substrates, followed by dicing and polishing to eliminate the growth substrate. The surface of the thick nitride layer must be touched to remove the growth substrate. This has proven to be a very costly process and by necessity has size limitations. Further, defects introduced via dicing and polishing and the inclusion of stresses due to the dicing processes limit the yield and viability of this approach. In these prior art techniques dual sided processing is impossible or very difficult. However, dual sided processing could offer unique advantages and lead to new types of devices.

In general, the need exists for high quality epitaxial elements which are epi-ready virgin as grown substrates that can be processed, handled, grown upon, and compatible with high temperature packaging and interconnect methods.

SUMMARY OF THE INVENTION

This invention is flexible semiconductor devices grown on flexible epitaxial elements whereby improved device performance is realized from the flexible nature and lower stress of the growth substrate or epitaxial element. The flexible growth substrate or epitaxial element is in the form of a freestanding thin flexible foil where the foil has at least one virgin growth surface that is ready for subsequent formation, growth, epitaxial growth, or deposition of additional layers necessary to form a flexible semiconductor device. An important aspect of this invention is that a virgin growth surface which has not required any surface preparation prior to the formation, growth, epitaxial growth, deposition of the additional layers necessary to form a flexible semiconductor device be present. This eliminates polishing, surface damage, and variable miscut angle defects from the epitaxial element. Unlike conventional silicon wafers which are sliced and polished prior to epitaxial growth of additional semiconductor layers, the disclosed epitaxial element has an as-grown virgin surface onto which the semiconductor device is formed. The embodiments of this invention may include or not include the flexible epitaxial element as a critical layer within the semiconductor device. As an example, the epitaxial element may be a 30 micron thick freestanding n-type doped gallium nitride foil onto which an InGaN/GaN MQW active region, an AlGaN electron blocking layer, and a p-type GaN layer is grown to form a flexible LED which has a radius of curvature less than 100 meters and even more preferably less than 1 m. It is important to note that if the epitaxial element is too thin it cannot be easily transported to the various deposition equipment and if it is too thick additional thinning steps will be required to make it flexible prior to or after deposition of the additional layers. If the thinning occurs prior to deposition of the additional layers, damage will occur to the as grown virgin epi ready surface and if the thinning occurs after the deposition of the additional layers the additional layers can be damaged and the benefit of growing on a flexible epitaxial element are lost. As such freestanding flexible epitaxial elements between 3 and 250 microns are preferred and even more preferably freestanding flexible epitaxial elements between 20 and 70 microns are more preferred. Again these epitaxial elements have a virgin as-grown epitaxy ready surface. The thinness of these epitaxial elements is also critical for the thermal time constant of the growth process for the semiconductor device layers. The heat capacity and thermal time constant of the epitaxial element is linearly related to the thickness of the epitaxial element and its specific heat and density. By minimizing the thickness of the epitaxial element the heat capacity and thermal time constant are minimized. The quality, accuracy, speed and cost of the semiconductor device layer growths on the epitaxial element are limited by the rate at which the epitaxial element can be heated and cooled. In conventional reactors large subsectors such as SiC are heated via resistive heaters to a specific growth temperature within the reactor. This defines the maximum rate of temperature increase and more importantly temperature decrease that can occur within the reactor. An embodiment of this invention is direct heating of the epitaxial element by actinic radiation wherein the epitaxial element absorbs at least a portion of the actinic radiation and is heated to a temperature within a reactor such that deposition, growth, curing, epitaxial growth, or formation of additional semiconductor device layer occurs. Preferably, the thickness of the epitaxial element is selected to result in a thermal time constant of less than 1 second. More preferably the reactor used to grow additional layers on the epitaxial element is an HVPE reactor. Growth rates within HVPE reactors can be very high exceeding microns per minute. By directly heating (e.g. by actinic radiation) an epitaxial element with a thermal time constant less than 1 second, several angstrom thick layers can be defined while maintaining high growth rates. This reduces the time necessary to grow semiconductor devices like MQWs (multiple quantum wells) which in turn reduces costs. Given that a complete LED structure can take 4 to 8 hours to grow using conventional MOCVD reactors, the use of HVPE approaches and low time constant epitaxial elements can reduce this growth cycle to less than 30 minutes. It should be noted that for vertical LED devices the epitaxial element becomes the n contact layer for the LED device with the MQW, electron blocking layer and p layers being deposited on the virgin as grown epitaxy ready surface of the epitaxial element. It should also be noted that it is critical that the epitaxial element be flexible and substantially homogenous in composition in order to withstand the rapid temperature changes that can now occur during deposition within the rapid thermal reactor processes disclosed. Freestanding flexible epitaxial elements disclosed herein have been demonstrated to withstand greater than 1000° C. per second temperature changes without cracking. Due to the bimorph nature and rigidity of most non-native template wafers, used in the prior art, much slower temperature changes are required to prevent cracking of the wafers. This results in the need for slower growth rates which in turn increase the time it takes to grow the device. This also illustrates the need for the surface of the epitaxial element to be virgin and as-grown to minimize surface defects. While the regrowth of additional n type material is an embodiment of this invention most preferably the minimal amount of additional growth layers is preferred. The formation of a buffer layer including but not limited to aluminum gallium nitride on the epitaxial element is disclosed to further enhance the growth quality of the additional semiconductor layers. In general, it is preferred that the virgin growth surface of the epitaxial element does not require any surface preparation prior to epitaxial growth processing. As an example, 20 to 70 micron thick silicon doped gallium nitride foils are harvested using the laser liftoff technique of Zimmerman to form an epitaxial element with a thermal time constant less than 1 second. More preferably the silicon doping concentration is between $10^{16}$ and $10^{20}$ per cubic centimeter. Even more preferably, this epitaxial element further exhibits an alpha of less than 0.1 per centimeter optical absorption at 440 nm.

Stress is a major concern in growing semiconductor devices like LEDs. Radius of curvature of the growth substrate is typically monitored in-situ to minimize the stresses during critical growth steps such as quantum well growth. Typically the goal is to increase the radius of curvature to greater than 1 km during critical growth steps. In general, the semiconductor industry is attempting to increase the radius of curvature (e.g. flatten wafers). Non-flat wafers can have non-uniform heating when heating platens are used in the growth reactor. It is inherent to epitaxial growth however that thermal mismatch will occur in any subsequent growth steps. Flexible epitaxial elements approach the problem from the opposite direction, as the flexible epitaxial element flexes, stresses can be reduced. In addition, the elemental composition of the epitaxial layers will change based on surface stresses. It has been observed with the epitaxial elements of this invention that their inherent flexibility enables higher indium compositions due to the lower surface stresses during growth of the additional semiconductor layers.

As such the flexible nature of the epitaxial element is a critical parameter in the growth of additional layers. Because the epitaxial element is not rigid during growth, lattice mismatch can be compensated for by the epitaxial element flexing during growth. This however illustrates the critical nature of the use of direct actinic heating of the epitaxial element. If uniform heating of the epitaxial element is desired especially for thin flexible epitaxial elements which may bow during device layer growth, the use of a subsector which conductively heats the epitaxial element is not preferred. By directly heating the epitaxial element with actinic radiation the speed of the process can be maintained and the uniformity of the growth on the epitaxial element can be very high. Using this approach a wide range of materials can be formed on the epitaxial element including but not limited to oxides, nitrides, arsenide's, silicon, antimonies, metals, dielectrics, gallants, aluminates, carbides or alloys of said materials. As an example, the n-type gallium nitride epitaxial element previously described can be directly heated using reflector focused IR lamps while in a HVPE reactor chamber. The IR is coupled directly onto the epitaxial element through a quartz window which is substantially transparent to the radiation from the lamp. But also because the reflector is focused on the epitaxial element the power density is much lower on the quartz window than on the epitaxial element within the chamber the majority of the heating occurs on the epitaxial element. Using this approach the epitaxial element can be raised from room temperature to 1000° C. in less than one second. Because only the epitaxial element is heated deposition occurs substantially only on the epitaxial element. Growth can be on one side or both sides depending on mounting and process gas flow characteristics within the reactor. Using this approach multiple semiconductor layers can be grown to form a wide range of device layers including but not limited to: an indium gallium nitride/gallium nitride quantum well, a p doped aluminum gallium nitride barrier layer, a p doped gallium nitride layer, and an electrical contact layer. These layers may be further processed with selective etching, doping, and interconnects to form at least one flexible semiconductor device, such as a light emitting diode, a solar cell, a RF device, or a power device. A preferred embodiment is to use at least one epitaxial element as a growth substrate for at least one low bandgap device. As an example, a multi-junction solar cell can be formed by growing a Silicon solar cell junction on the previously disclosed gallium nitride epitaxial element after a nitride solar cell junction is grown. Low bandgap devices like silicon typically are grown at lower processing temperatures than high bandgap devices like nitrides. Therefore a preferred embodiment of this invention is the growth of high bandgap devices on high bandgap epitaxial elements followed by the growth of low bandgap devices on the high band gap devices. This prevents the degradation of low bandgap devices that occurs if they are exposed to the high growth temperature of the high bandgap devices. Using this approach a wide range of flexible semiconductor devices can be formed including but not limited to a solar cell, a multi-junction solar cell, a RF device, a power device, a piezoelectric device, an LED, a laser diode, an EELED, a biomedical device, or 3D semiconductor devices.

A further embodiment of this invention is the formation of a flexible semiconductor device on a flexible epitaxial element which is further deposited on both sides of the epitaxial element. As an example the LED structure described above is further coated or deposited on with a transparent conductive oxide. Even further at least one outer layer of the flexible semiconductor device is a degenerative doped zinc oxide alloy with dopant concentration greater than $10^{18}$ $cm^{-3}$ and with a thickness greater than 5000 angstroms. Using this approach high quality holmic contacts can be formed to the flexible semiconductor device using printed thick epitaxial element contacts. Because the flexible semiconductor devices disclosed in this invention do not contain any wafer bonding steps high temperature firing of thick epitaxial element inks and pastes are possible similar to those used in the solar industry to make contacts for silicon solar cells.

In general, the epitaxial element is flexible, has a virgin as grown epitaxy ready surface with a substantially uniform crystal plane across the virgin as grown epitaxy ready surface.

These freestanding epitaxial elements offer several advantages over: semiconductor layers which are transferred to a secondary substrate via wafer bonding techniques, processes using layers which remain on their growth substrate like sapphire or silicon carbide, and diced and polished nitride wafers. These advantages include lower layer stresses and the ability to process both sides.

In addition, the formation of non-circular devices offers several advantages with regard to device performance. There is the potential to reduce stress and enhance extraction efficiency where the edges of the devices are aligned to natural cleavage planes. Triangular shaped die can be effectively utilized to form recycling light cavities, which can enhance radiance to light emitting diode light sources. In copending patent applications methods of forming large area flexible freestanding semiconductor devices based on the removal of thick HVPE epitaxial layers from sapphire substrates are shown. The resulting freestanding epitaxial elements enable increased flexibility in packaging and device design. The need therefore exists for methods and articles, which take advantage of these flexible freestanding semiconductor devices and provide techniques which take advantage of the material, geometry, thermal mass, and flexibility of these flexible freestanding semiconductor devices.

In copending patent applications, it has been shown that stacked LEDs, solar cells, and other optoelectronic devices based on flexible freestanding semiconductor devices offer significant advantages from the standpoint of current spreading, functionality, color combining, and peak drive levels. Nitride alloys and zinc oxide alloys offer a unique set of properties with regard to optical, electronic and optoelectronic devices. Further, it has been shown that epitaxial elements described herein enable flexible freestanding semiconductor devices, which exhibit alpha less than 1 cm-1 throughout the visible spectrum, can be created with thicknesses ranging from 20 microns to over 100 microns, which also exhibit resistivity less the 0.05 ohm cm and a thermal conductivity approaching 200 W/m/K with sufficient areas to enable device fabrication. This unique combination of properties at a thickness and area sufficient for handling and subsequent processing permits unique processing techniques including dual sided processing.

As disclosed previously, the use of flexible freestanding semiconductor devices containing MQW structures can be used to create isotropic light sources and the use of stacked flexible freestanding epitaxial elements with different MQW structures can be used to create isotropic white light sources. The combination of these devices with solid wavelength conversion materials has also been disclosed in a pending patent application.

The disclosed flexible epitaxial elements may be processed using but not limited to epitaxial growth, deposition, laser patterning, and printing. In addition various interconnect means can be added on one or both sides of flexible freestanding semiconductor devices for the formation of 3 dimensional devices and dual side processes. The epitaxial elements can be used to create 3 dimensional devices at reduced cost compared to bulk wafer approaches. As an example, while native Nzo wafers have been fabricated, their cost is restrictive and they lack a suitable/stable p-dopant which limits their applications. The combination of p type nitride alloys and n type zinc oxide alloys, wherein either the nitride alloy or zinc oxide alloy is a flexible epitaxial element is a preferred embodiment of this invention.

Further, the freestanding flexible epitaxial elements disclosed exhibit the ability to cleave, can be implanted within the body, can form piezoelectric elements, can be lased into high precision parts, can regrow low defect density layers, can eliminate extra thermal boundary layers, can operate in harsh chemical environments, can operate at higher frequencies, can form a freestanding waveguide, anneal, and form a 3 dimensional structure.

In the case of nitride epitaxial elements harvested from c-plane sapphire a uniaxial bow exists at room temperature. The foils however flatten out above 500 C. Given the significantly different thermal expansion properties of the sapphire, this clearly shows that the flexible nature of the nitride epitaxial element reduces stress relative to the same nitride layer constrained on sapphire.

While the majority of the examples disclosed herein are based on nitrides and zinc oxides, flexible epitaxial elements with a virgin as grown epitaxy ready surface can alternatively be a wide range of materials. High bandgap materials such as diamond, nitrides, oxides and carbides are most preferred based on their ability to withstand high temperature processing. However silicon, arsenides, silicon alloys, germinates, gallates, and other materials can be processed similarly. Nitride and zinc oxide alloys including but not limited to GaN, InN, AlN, GaInN, AlInN, GaInALN, dilute nitrides, and zinc oxide alloys containing at least two of the following elements, Zn, O, Ga, Al, and In. A variety of crystal planes may be formed and used including but not limited to c, m and various miscut angle crystal planes. The use of these flexible freestanding epitaxial elements in applications which take advantage their properties including but not limited to high thermal conductivity, piezoelectric properties, bio-compatibility, chemical resistance, laser machinability, cleavability, low coefficient of thermal expansion, low optical absorption, luminescent properties, as well as other physical properties is an embodiment of this invention. Because the epitaxial elements are flexible the resulting semiconductor devices can be bowed and attached to a wide range of flat and non-flat surfaces. This allows for attachment to or incorporation onto and/or into heatpipes and other non-flat surfaces.

This technique does not require wafer bonding, heating, chemical etching, or other techniques after epitaxial growth steps to create the flexible semiconductor devices. More importantly, epitaxial growth occurs on a non-rigid epitaxial element allowing for stress reduction via flex during layer growth.

The enhancement or modification of spectral output of LED structures based on the use of freestanding flexible freestanding epitaxial elements is also an embodiment of this invention. By flexing the LED structure the spectral output of the LED can be changed due to the anistropic nature of the stresses within the layers and epitaxial element. Even more preferably, semiconductor layers and epitaxial elements disclosed can used to form single sided, double sided, multilayer, and or 3 dimensional circuits. Regrowth of additional epitaxial layers on either or all surfaces is also an embodiment of this invention. Devices can be formed including but not limited to optical, electrical, optoelectronic, electromechanical and combinations of each on at least one epitaxial element.

Vias formed by but not limited to etching, laser cutting, and mechanical means can connect flexible freestanding semiconductor devices containing at least one epitaxial element. The formation of micro channels within the thin flexible freestanding epitaxial element prior to or after growth of the semiconductor device layers to permit enhanced cooling via air and/or liquid cooling means is also an embodiment of this invention.

The freestanding flexible epitaxial elements disclosed can be coated, handled, segmented, printed on, grown on (epitaxially and non-epitaxially) and processed at elevated temperatures.

The growth of additional layers on the epitaxial element to inhibit fracture and enhanced structural integrity is disclosed. This regrowth may also be used to further reduce dislocation defects. As an example, at least one gallium nitride epitaxial elements may be placed in an HVPE reactor and additional thickness added to one or both sides of the epitaxial element. Alternately, two gallium nitride foils physically, chemically, or otherwise mounted such that the virgin as grown epitaxy ready surfaces form outer surfaces of a sandwich of epitaxial elements may be used for regrowth of lower dislocation density layers. After regrowth the two epitaxial elements may be separated. It should be noted that HVPE is preferred not only because of it high growth rates but also because of its low raw material costs compared to MOCVD. Over 100× difference in raw material costs are typical The use of high temperature annealing steps for the flexible freestanding epitaxial element after removal of the growth substrate is an embodiment of this invention. The use of high temperature annealing steps after removal of the growth substrate and at least one side coated with a transparent conductive oxide is also an embodiment.

Optoelectronic devices, not limited to, LEDs, laser diodes, solar cells, biomedical devices, thermoelectrics, and other optoelectronic devices that are fabricated on these epitaxial elements are embodiments of this invention.

In addition, the refractive index of the epitaxial element and/or the additional layers can be controlled via alloy composition. The formation of flexible light guiding or light extraction optical elements based on flexible epitaxial elements with or without additional layers is an embodiment of this invention.

Alternately, the mechanical properties of the epitaxial element and/or additional layers can be useful for applications such as bimorphs, unimorphs, cantilevers, micro-actuators and other MEMS type devices. The formation of layers on one or both sides of the epitaxial element for mechanical and/or acoustomechanical applications is disclosed.

A preferred embodiment of this invention are nitride alloys which contain but are not limited to AlGaN, InGaN, AlInGaN, GaN, AlN, InN, InAlN as well as P and As alloys typically referred to as dilute nitrides. The modification of the resulting epitaxial elements via etching, mechanical means, laser, and other techniques known in the art to reduce thermal conductivity, create optical structures, form composites for optoelectronic, thermoelectric, solar, and/or piezoelectric devices is an embodiment of this invention.

The use of dopants to impart luminescent, n doping, p doping, semi-insulating and degenerative properties to the epitaxial elements disclosed are also included in the configurations listed. In particular, the use of Al, Ga, and Mg to form highly conductive transparent layers as dopants or alloys to ZnO as epitaxial elements is an embodiment of this invention.

The use of flexible epitaxial elements as a growth substrate to enhance the optical, electrical, mechanical and mobility of thick transparent conductive oxides is an embodiment of this invention. In this invention it has been found that the quality of Al doped ZnO grown on a flexible epitaxial element is inherently higher than when the nitride epitaxial elements is still attached to a sapphire substrate. The constrained nature of the nitride on sapphire or any other growth substrate including AlN negatively affects the subsequent growth of the ZnO layers. The use of the epitaxial elements of this invention yields better ohmic contacts and better optical properties, which in turn lead to better device performance. In addition the use of the excess gallium formed during laser separation to further dope the transparent conductive oxide is beneficial to the resulting properties of the film. The ability to epitaxially grow high quality transparent conductive layers with very good optical properties also enables the use of high temperature and/or high energy processes. As an example laser welding of silver and aluminum ribbon direct to 1.5 micron thick ZnO has been demonstrated with very low contact resistance and is an embodiment of this invention. Unlike amorphous and polycrystalline growths (typically used to deposit these layers) epitaxial growth on flexible epitaxial elements provides not only high electrical conductivity, but also provides very low optical absorption losses. Enhanced extraction off of one or both sides of the flexible semiconductor devices based on index matching is also disclosed. As an example, zinc oxide exhibits a lower refractive index then gallium nitride. As such, the use of zinc oxide layers as index matching, cladding layers, and other optical elements is an embodiment of this invention.

Flexible epitaxial elements allow for unique packaging and device fabrication. In particular, freestanding epitaxial elements can be easily cut, patterned, and perforated using laser and other actinic radiation sources. The formation of multiple layer devices is an embodiment of this invention. This includes but is not limited to, multi-layer interconnects, heat sinks, micro-optical devices, LED arrays, and solar cells.

Semiconductor devices containing epitaxial elements on which MQWs are grown can be stacked and interconnected. By using the highly transparent conductive layers described herein, emitting volumes can be formed. Rather than have a very large die with large variations in drive currents across the die, stacked die can not only improve the current spreading across a given area but increase the lumens/etendue or radiance of the device. Similarly, this same technique can be use to form more efficient and concentrated solar cells and electronic devices such as IGFETS. With nitrides, current spreading limitations tend to be more severe than thermal effects, therefore volume emitters tend to be more efficient than surface emitters. Low absorption and high quality ohmic contacts are required to enable volume emitters like these. The use of epitaxially grown transparent conductive layers on semiconductor devices containing at least one epitaxial element stacked to form volume emitters, absorbers, and electrical devices is an embodiment of this invention. Alternately, power devices especially high voltage power devices benefit from vertical structures made of thicker layers. Flexible freestanding epitaxial elements disclosed herein allow for low cost homoepitaxial growth substrates onto which thicker, higher crystal quality additional semiconductor layers can be grown on one or both sides of the epitaxial element.

Geometry plays a critical role in volume emitters versus surface emitters. Here is a simple example: A typical nitride LED less than 10 microns in thickness and 300 micron..times.300 micron in area has an emitting area equal to 0.09 mm.sup.2. If the same size die is 100 micron thick there is more emitting area (0.12 mm.sup.2) on the sides of the die than the top surface of the die. There are a number of advantages to this configuration. It is well known that recombination losses are minimized directly under electrical contacts on LEDs. Utilizing large reflective contacts on the top and bottom of the freestanding nitride LED enable very high extraction efficiency out the sides of the die. The extraction efficiency is further enhanced using this geometry by the tendency for a substantial portion of the light generated within the active layer to be waveguided to the edges. The use of thick epitaxial elements to create LEDs in which the output area of the surface normal to the active layer plane is larger than the output area of the surface parallel to the active layer plane is an embodiment of this invention. Further, the use of stacks of epitaxial elements to create emitters or absorbing volumes which take advantage of the increased side output area is an embodiment of this invention. The formation of opaque reflective contacts on both surfaces parallel to the active layer plane to further increase thermal cooling and current injection and permit the light to exit or enter via the surfaces normal to the active layer plane are embodiments of this invention.

The thickness of the flexible semiconductor device is a critical element in overall device performance. While a reasonable thickness is required to enable: handlability, permit low defect density, and optimum device geometry, there are several device performance attributes, which require the flexible epitaxial elements to be as thin as possible. These attributes include cost, thermal impedance, series resistance, ease in forming high resolution vias and interconnects, flexibility, and low internal absorption losses. Another key attribute is the ability to rapidly change temperature during growth processes. As an example, nitride templates grown on non-native growth substrates significantly limit allowable growth conditions due to bowing and cracking due to the mismatch of thermal properties (e.g. expansion) of the two materials. During growth on templates such as these the radius of curvature can be both positive and negative within a given growth cycle. Flexible epitaxial elements not only eliminate these effects but also enable the use of rapid thermal processing steps for the formation of quantum wells (QW), multiple quantum wells (MQW), superlattice and other epitaxial structures which require rapid large transitions in reactor growth temperatures. Many semiconductor devices require a large number of layers to be grown sequentially in the reactor. Therefore, reduction in the growth time or transition times of each layer can significantly impact overall device cost. Flexible epitaxial elements not only have inherently lower thermal mass based on thickness than the more conventional wafer, but epitaxial elements based on nitride have lower specific heats than sapphire, silicon, and SiC. This can enable the use of higher growth rates while still maintaining layer composition and thickness control. Growing a 100 Angstrom layer with a 1 micron per minute growth rate would require less than 1 second. Accurate and well defined thin layers as used in MQW structures and power device all benefit from the low thermal mass the short thermal time constant of the epitaxial elements disclosed in this invention. These properties coupled with a properly designed rapid thermal reactor design enable unique processing advantages over the prior art.

In addition, the use of thick transparent conductive oxides to enhance the structural integrity of the flexible semiconductor device containing an epitaxial element for improved handleability is also disclosed. Preferably, the formation of greater than 5000 Angstroms of a transparent conductive oxide (TCO) on one or both sides of a semiconductor device containing at least one epitaxial element is a preferred embodiment of this invention. Even more preferred, is the formation of greater than 5000 Angstroms of a TCO on both sides of a freestanding nitride epitaxial element. These layers can be used to inhibit fracture as well as provide interconnect to the underlying device structure.

The use of high temperature annealing steps on the epitaxial element after removal of the growth substrate is an embodiment of this invention. The use of high temperature annealing steps after removal of the growth substrate and at least one side coated with a transparent conductive oxide is also disclosed.

The use of epitaxial elements to form flexible semiconductor devices with very low Vf devices without the need for rapid thermal annealing to make ohmic contacts is disclosed.

By eliminating the need for rapid thermal annealing, high reflectivity ohmic contacts can be readily formed. Typically complex metallization steps are required due to the degradation typically induced by the rapid thermal annealing steps. The epitaxial growth of the transparent conductive layer may be on one or both sides of the large area flexible epitaxial element.

By epitaxially growing a thick transparent conductive layer, several device parameters are improved significantly. These include mechanical integrity, turn-on voltage, contact resistance, ESD stability, and the ability to form ohmic contacts.

Optoelectronic devices, not limited to, LEDs, laser diodes, solar cells, biomedical devices, thermoelectrics, and other optoelectronic devices that are fabricated on flexible epitaxial elements are embodiments of this invention.

In addition, the refractive index of the flexible freestanding epitaxial elements can be controlled via alloy composition. The formation of light guiding or light extraction optical elements based on flexible epitaxial elements with or without layers is an embodiment of this invention.

Alternately, the mechanical properties of the freestanding epitaxial elements can be useful for applications such as bimorphs, unimorphs, cantilevers, micro-actuators and other MEMS type devices. The formation of layers on one or both sides of the flexible epitaxial element for mechanical and/or acousto-mechanical applications is disclosed.

A preferred embodiment of this invention are nitride alloys which contain but are not limited to AlGaN, InGaN, AlInGaN, GaN, AlN, InN, InAlN as well as P and As alloys typically referred to as dilute nitrides. The modification of the resulting freestanding flexible semiconductor devices via etching, mechanical means, laser, and other techniques known in the art to reduce thermal conductivity, create optical structures, form composites for optoelectronic, thermoelectric, solar, and/or piezoelectric devices is an embodiment of this invention.

With regard to transparent conductive layers, most preferred, is the use of doped oxide alloys of zinc formed via MOCVD or other epitaxial methods as transparent conductive outer layers.

The use of dopants to impart luminescent, n doping, p doping, semi-insulating and degenerative properties are also included in the configurations listed. In particular, the use of Al, Ga, and Mg to form highly conductive transparent layers as dopants or alloys to ZnO is an embodiment of this invention.

The use of flexible freestanding epitaxial elements as a growth substrate to enhance the optical, electrical, mechanical and mobility of thick transparent conductive oxides is an embodiment of this invention. In this invention it has been found that the quality of Al doped ZnO grown on a flexible epitaxial element such as 30 micron thick gallium nitride is inherently higher than when the nitride epitaxial elements is still attached to a sapphire substrate. The constrained nature of the nitride on sapphire or any other growth substrate including AlN negatively affects the subsequent growth of the ZnO layers. Using a flexible epitaxial element translates into better ohmic contacts and better optical properties, which in turn lead to better device performance. In addition the use of the excess gallium formed during laser separation to further dope the transparent conductive oxide is beneficial to the resulting properties of the film. The ability to epitaxially grow high quality transparent conductive layers with very good optical properties also enables the use of high temperature and/or high energy processes. As an example laser welding of silver and aluminum ribbon direct to 1.5 micron thick ZnO based TCOs has been demonstrated with very low contact resistance and is an embodiment of this invention.

Additional semiconductor layers can be used to form a tough outer skin, which reduces cracking due to crystal plane differences between the epitaxial element and the additional semiconductor layers. This can be done on one or both sides of the epitaxial element. Optical layered structures may also be incorporated into the semiconductor device based on the refractive index of the epitaxial element and the additional semiconductor layers. These optical structures can be used for index matching, cladding layers, and other optical elements and are an embodiment of this invention.

Semiconductor devices grown on epitaxial elements allow for unique packaging and device fabrication. In particular, based on their thinness epitaxial elements especially nitrides and oxides can be easily cut, patterned, and perforated using laser and other actinic radiation sources. The formation of multiple layer devices is an embodiment of this invention. This includes but is not limited to, multi-layer interconnects, heat sinks, micro-optical devices, LED arrays, and solar cells.

The use of degenerative highly doped transparent conductive layers, like but not limited to aluminum doped zinc oxide, enable the formation of stacked layers which can be electrically connected either across the entire area of each layer or spatially selectively attached. The ability to form 3 dimensional devices and circuits containing at least one epitaxial element and transparent conductive layers is an embodiment of this invention.

As current density increases on devices like LEDs, current spreading becomes a limiting factor in device performance especially for large area devices. In co-pending patent applications, flexible epitaxial elements on which MQWs are grown can be stacked and interconnected. By using the highly transparent conductive layers described herein, emitting volumes can be formed. Rather than have a very large die with large variations in drive currents across the die, stacked die can not only improve the current spreading across a given area but increase the lumens/etendue or radiance of the device. Similarly, this same technique can be use to form more efficient and concentrated solar cells and electronic devices such as IGFETS. With nitrides, current spreading limitations tend to be more severe than thermal effects, therefore volume emitters tend to be more efficient than surface emitters. Low absorption and high quality ohmic contacts are required to enable volume emitters like these. The use of epitaxially grown transparent conductive layers on epitaxial elements stacked to form volume emitters, absorbers, and electrical devices is an embodiment of this invention. In these cases the virgin as grown epitaxy ready surface is used to enhance the quality of the additional semiconductor layers.

While thickness is a critical parameter for flexibility in some cases the use of flexible epitaxial elements to enable thick additional semiconductor layers is disclosed.

As stated earlier the thickness of the flexible epitaxial element is a critical element in overall device performance.

While a reasonable thickness is required to enable: handleability, permit low defect density, and optimum device geometry, there are several device performance attributes, which require the overall semiconductor device to be as thin as possible. However, high voltage devices are another example of when thicker additional semiconductor layers are preferred. In this case the main benefit of the flexible epitaxial elements is to improve the epitaxial quality of the additional semiconductor layer or layers grown on the epitaxial element and reduce processing time to grow the layer. As an example, greater than 100 micron thick nitride alloy can be grown on a flexible gallium nitride epitaxial element 30 microns thick. The homoepitaxial nature of this growth allows for thick additional semiconductor layers to be grown without cracking. Dislocation defects can be reduced to less than 10(5) per centimeter squared as known in the art. However, HVPE growth is preferred to reduce carbon contamination typically associated with MOCVD growths. It is believed that the carbon contamination from MOCVD growth localizes in the dislocation defect regions which leads to leakage. As such the use of HVPE growth for the epitaxial elements and additional semiconductor layers is preferred.

DETAILED DESCRIPTION OF THE INVENTION

Figure 1A:
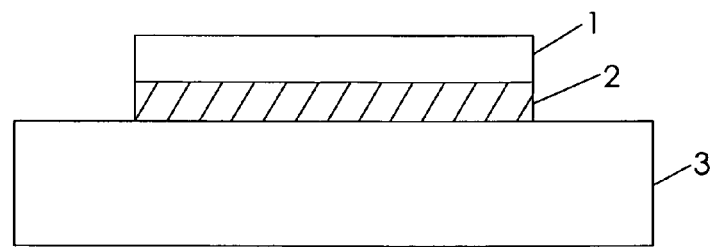
FIG. 1 depicts a thin GaN layer waferbonded and laser liftoff onto a silicon submount.
Figure 1B:
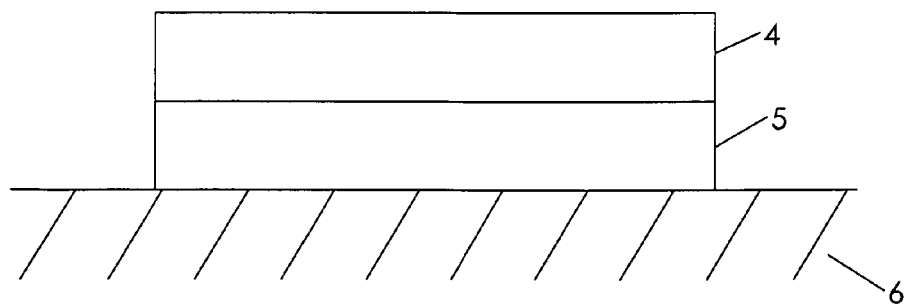

FIG. 1A depicts a typical waferbonded nitride device as seen in high powered LEDs. In this case, the flexible freestanding epitaxial element 1 typically contains a MQW structure and associated contact layers and metallizations as known in the art. The flexible freestanding epitaxial element 1 is attached via solder layer 2 to support 3, which is typically a thermally conductive material like silicon, germanium, or metal composites. The typical thickness of the flexible freestanding epitaxial element 1 is less than 3 microns and the flexible freestanding epitaxial element 1 lacks the mechanical integrity to be handled or processes without being attached to support 3. In addition, the stresses with the flexible freestanding epitaxial element 1 cause it to warp significantly if it were not attached to support 3. The thermal impedance through the solder layer 2 and support 3 determines the maximum power density of the device. Alternately FIG. 1 B depicts a flexible freestanding epitaxial element 4 on growth substrate 5 which may consist of, but not limited to, SiC, diamond, sapphire, and glass. In these cases, a thermal boundary exists at the interface between flexible freestanding epitaxial element 4 and growth substrate 5. Even though the flexible freestanding epitaxial element 4 is epitaxially grown on growth substrate 5, a portion of the phonons transmitting the heat from the junction to the cooling means 6 are reflected back toward the junction within flexible freestanding epitaxial element 4. In addition, the strain and stresses induced during the growth of flexible freestanding epitaxial element 4 due the lattice mismatch with growth substrate 5 cannot be controlled or modified.

Figure 2:
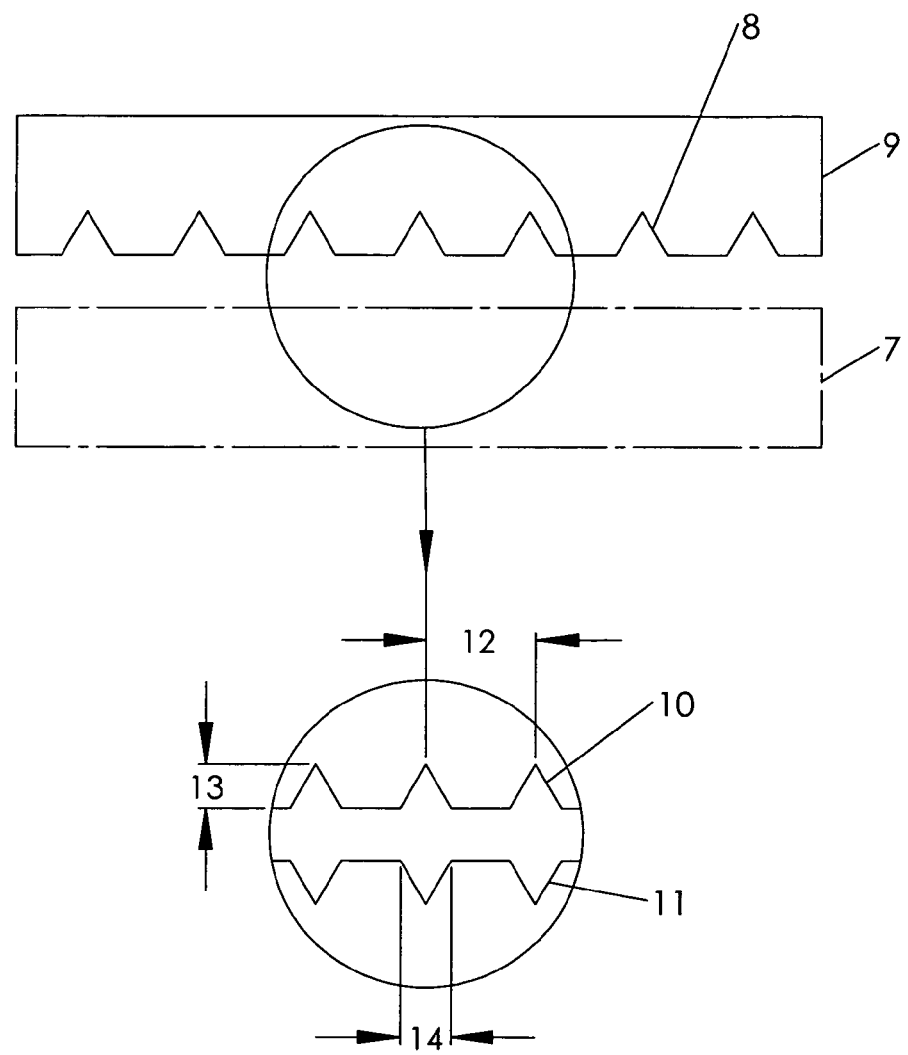
FIG. 2 depicts a thin GaN layer with stress control features formed on the epitaxial layer side of the thin GaN layer of the present invention.

FIG. 2 shows a flexible freestanding epitaxial element 9, which contains stress control features 8. These stress control features 8 are created at the interface between flexible freestanding epitaxial element 9 as it was separated from growth substrate 7 in a semiconductor structure device. Flexible freestanding epitaxial element 9 may be in the form of but not limited to tapes, fibers, ribbons, wafers, or foils. Growth substrate 7 may consist of but not limited to tapes, fibers, ribbons, wafers or foils of sapphire, glass or combinations of both. The use of composite tapes containing sapphire fibers within a glass matrix for growth substrate 7 is included as an embodiment. Flexible freestanding epitaxial element 9 is substantially single crystal in nature and may be composed of GaN, AlN, InGaN, InN, AlInN, AlGaN, BN, and dilute nitrides. Flexible freestanding epitaxial element 9 is substantially epitaxially grown on growth substrate 7. Highly focused laser radiation can create these features. An expanded view of the interface shows that expanded nitride feature 10 and growth substrate feature 11 are both formed using this approach. Even though the growth substrate 7 is transparent to the radiation spectrum, some material removal occurs from growth substrate 7. In the case of flexible freestanding epitaxial element 9, even expanded nitride feature 10 can be formed in AlN which has little to no absorption to the radiation spectrum. Depending on the spacing and depth of expanded nitride feature 10, the flexible freestanding epitaxial element 9 can be removed or remain on the growth substrate 7.

Spacing, size, orientation to crystal planes, and density of the stress control features 8 can be used to control the flatness of the flexible freestanding epitaxial element 9. These parameters can also be used to determine whether flexible freestanding epitaxial element 9 separates fully or partially from growth substrate 7. The use of these parameters controls stress and separation either separately or simultaneously. The non-linear optical response of the interface between growth substrate 7 and flexible freestanding epitaxial element 9 to laser radiation for which neither element exhibits significant absorption to the laser radiation spectrum is also an embodiment of this invention.

The use of spacing, depth, size and orientation of stress control features 8 causes separation without feature overlap. The resulting flexible freestanding epitaxial element 9 containing stress control features 8 consist of features separated by feature spacing distance 12 where feature spacing distance 12 is greater than the width of the feature 14. More preferably flexible freestanding epitaxial elements 9 feature spacing distance 12 between 1 micron and 100 microns. The width of the feature 14 is between 1 micron and 50 microns. The ratio of feature depth 13 to width of the feature 14 is greater than 0.1. Variable spacing is used for stress control features 8. Additive approaches in which multiple exposures using the same or different orientations of laser exposure form stress control features 8.

Figure 3:
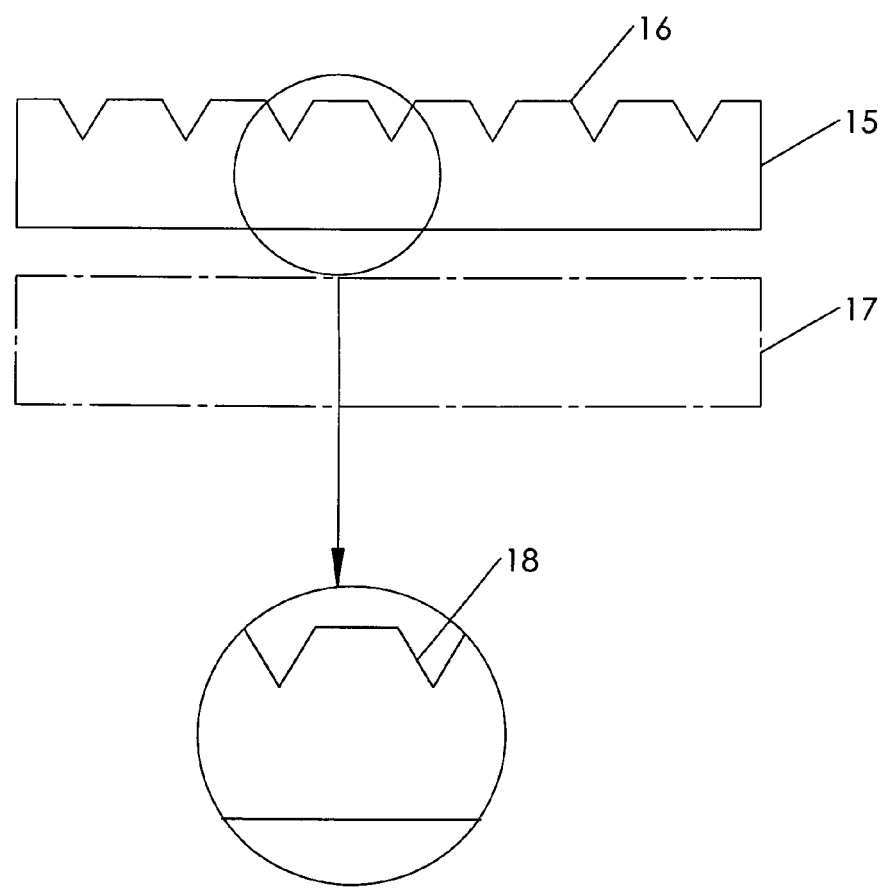
FIG. 3 depicts a thin GaN layer with stress control features formed on the outside surface of the thin GaN layer of the present invention.

FIG. 3 depicts the formation of stress control features 16 on flexible freestanding epitaxial element 15. The stress control features 16 can be formed prior to or after separation from growth substrate 17. Cleaning steps including, but not limited to, plasma, chemical etching, evaporation, and mechanical means remove excess metals. Laser scribing methods define the outer dimension of the flexible freestanding epitaxial element 15. Expanded feature 18 illustrates a typical stress control feature. Alternately, the high aspect ratio of created using techniques like laser ablation can create high aspect ratio features that are particularly advantageous to regrowth processes. Addition, etching via photochemical, chemical, or mechanical means can allow for improved regrowth. The dual usage of stress control features 16 as stress control and regrowth sites is an embodiment of this invention. More preferably the use of a dense array of high aspect ratio stress control features 16 in conjunction with regrowth conditions which preferentially favor lateral growth is preferred. The use of sacrificial coatings such as SiO2 prior to formation of stress control features 16 to further encourage lateral growth on coalescence on a micron scale is even more preferred. The resulting flexible freestanding epitaxial element 15 is an embodiment of this invention.

More preferably, the formation of non-circular shapes is preferred. The usage of non-circular shapes increases the fill ratio and/or usable flexible freestanding epitaxial element 15 area in subsequent growth and processing stages. Even more preferably, the formation of flexible freestanding epitaxial element 15 as a square or rectangular area with a dimension equivalent to a multiple of the individual die being fabricated (e.g. 1 mm.times.1 mm LEDs) maximizes the amount of useful area. In general, tapes, fibers, foils, wafers, and ribbons are used. The formation of retaining features, either internal to perimeter of flexible freestanding epitaxial element 15 or along the perimeter to of flexible freestanding epitaxial element 15, support, suspend, align and/or contain the flexible freestanding epitaxial element 15 during subsequent regrowth and processing. Because the only constraint of shape and features in the flexible freestanding epitaxial element 15 is based on the resolution of the laser scribing equipment, the need to make round wafers is removed. Unlike boule based processes such as silicon where the wafers are formed from cylindrical boules, circular wafers are not required or preferred. In the same manner that polycrystalline solar cells have moved away from wafer based processing, this technique enables the formation of a variety of form factors for enhanced yield and functionality. This aspect is especially important with regard to the use of flexible freestanding epitaxial element 15 as a circuit layer where edge alignment for registration between layers or photomasks is typically required or desired. The use of non-circular flexible freestanding epitaxial element 15 for alignment and registration means forms single layered or multilayered circuits.

Figure 4A:
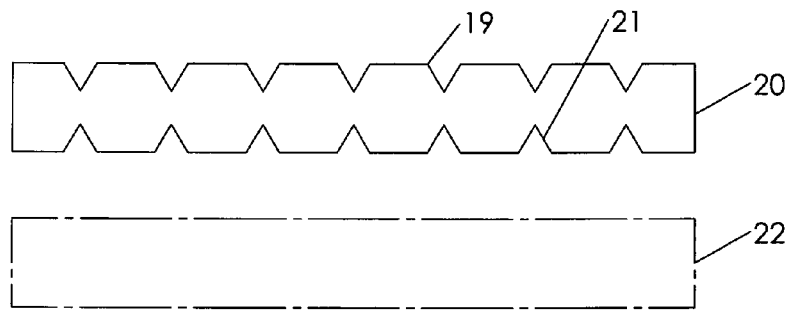
FIG. 4 depicts a thin GaN layer with stress control features formed on both sides of the thin GaN layer of the present invention.
Figure 4B:
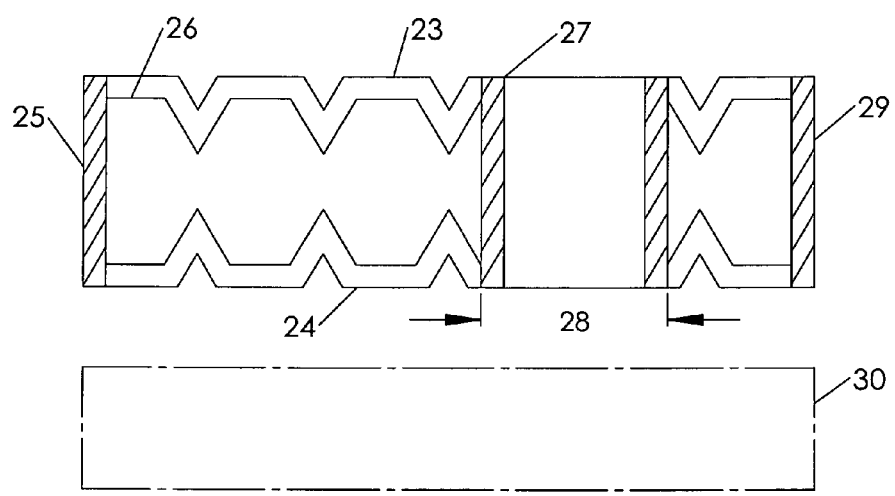

FIG. 4A depicts a flexible freestanding epitaxial element 20 in which stress control features 19 and 21 have been formed both sides of flexible freestanding epitaxial element 20. The formation of stress control features 19 and/or 21 can be prior to, simultaneous to, and/or after removal of growth substrate 22. The orientation, density, shape, orientation to crystal planes and depth of stress control features 19 and/or 21 can be similar, different, or the same so as to control the flatness, regrowth conditions, thermal cooling or extraction efficiency of the flexible freestanding epitaxial element 20. FIG. 4B depicts flexible freestanding epitaxial element 26 with top layer 23, outer edge layers 29 and 25, bottom layer 24 and via feedthru layer 27. In a manner similar to a printed circuit board, it is an embodiment of this invention that flexible freestanding epitaxial element 26 be used as a circuit substrate.

The formation of vias, feedthrus, and other interconnect means are an embodiment of this invention. As such the use of semi-insulating, insulating, doped and layered growths for the flexible freestanding epitaxial element 26 is an embodiment of this invention. Top layer 23 and bottom layer 24 include but are not limited to transparent conductive oxides, dielectrics, and conductors. The use of these layers and vias interconnects devices created via standard semiconducting means on flexible freestanding epitaxial element 26 either subsequent to separation from growth substrate 30 or after separation. In this manner multiple levels of interconnect and device structure can be created on a single flexible freestanding epitaxial element 26. As an example, MQW LEDs and their associated drive elements might be formed while the flexible freestanding epitaxial element 26 is still attached to growth substrate 30 using MOCVD growth and photolithography and etching processes as known in the art. After separation from growth substrate 30, the use of printing, additive and subtract methods, and photolithographic means to form interconnect, resistors might be used to connect the functional devices formed during the initial processing. In this manner, steps requiring high temperature processing and high resolution lithography could be performed on a wafer level while the low resolution and/or low temperature steps could be perform on the flexible freestanding epitaxial element 26. This approach could be used to increase yield, enable the use of high current interconnect via thick epitaxial element processing, allow for an intermediate testing step, and the use of materials not compatible with standard wafer processing.

Alternately, the high temperature capability of the flexible freestanding epitaxial element 26 enables the use of high temperature thick epitaxial element processing. The chemical resistance of the flexible freestanding epitaxial element 26 allows for the use of a variety of chemical treatments that may or may not be compatible with the growth substrate 30 including but not limited to electroplating, chemical etching, anodizing, plasma spray, spin coating, and spray coating. These techniques, either singularly or with another step, can form a circuit using the flexible freestanding epitaxial element 26. The use of the high thermal conductivity of the flexible freestanding epitaxial element 26 forms a thermally conductive core either locally within a printed circuit board or flex circuit. The flexible freestanding epitaxial element 26 can contain semiconductor devices embedded, laminated to, or attached via mechanical means such that connection is made to the semiconductor devices formed on flexible freestanding epitaxial element 26. The growth of devices including MQWs, 2DEGs, SQWs, DHJ, HEMTs, SHJ, PN, and other semiconductor and optoelectronic structures as known in the art on either the flexible freestanding epitaxial element 26 by itself or the flexible freestanding epitaxial element 26 on growth substrate 30 is an embodiment of this invention. Even more preferably, the flexible freestanding epitaxial element 26 can be embedded within an optical interconnect laminate in which the flexible freestanding epitaxial element 26 contains at least one laser diode.

The cleavable nature of the flexible freestanding epitaxial element 26 can form at least one facet of the laser diode. Because nitrides can not only be used to form emitting devices such as LEDs, EELEDs, and laser diodes, but also operate at very high frequencies and power levels, they are ideally suited for use in optical interconnects and other optoelectronic applications. The ability to integrate multiple devices within the flexible freestanding epitaxial element 26 is an embodiment of this invention. The use of epitaxial layers which exhibit tensile or compressive stress for either and/or both top layer 23 and bottom layer 24 can act as compensation layers to control flatness of flexible freestanding epitaxial element 26. The use of amorphous or polycrystalline layers can control the flatness for either and/or both top layer 23 and bottom layer 24 as compensation layers to control flatness of flexible freestanding epitaxial element 26. The combination of these approaches with stress control features is an embodiment of this invention.

Figure 5:
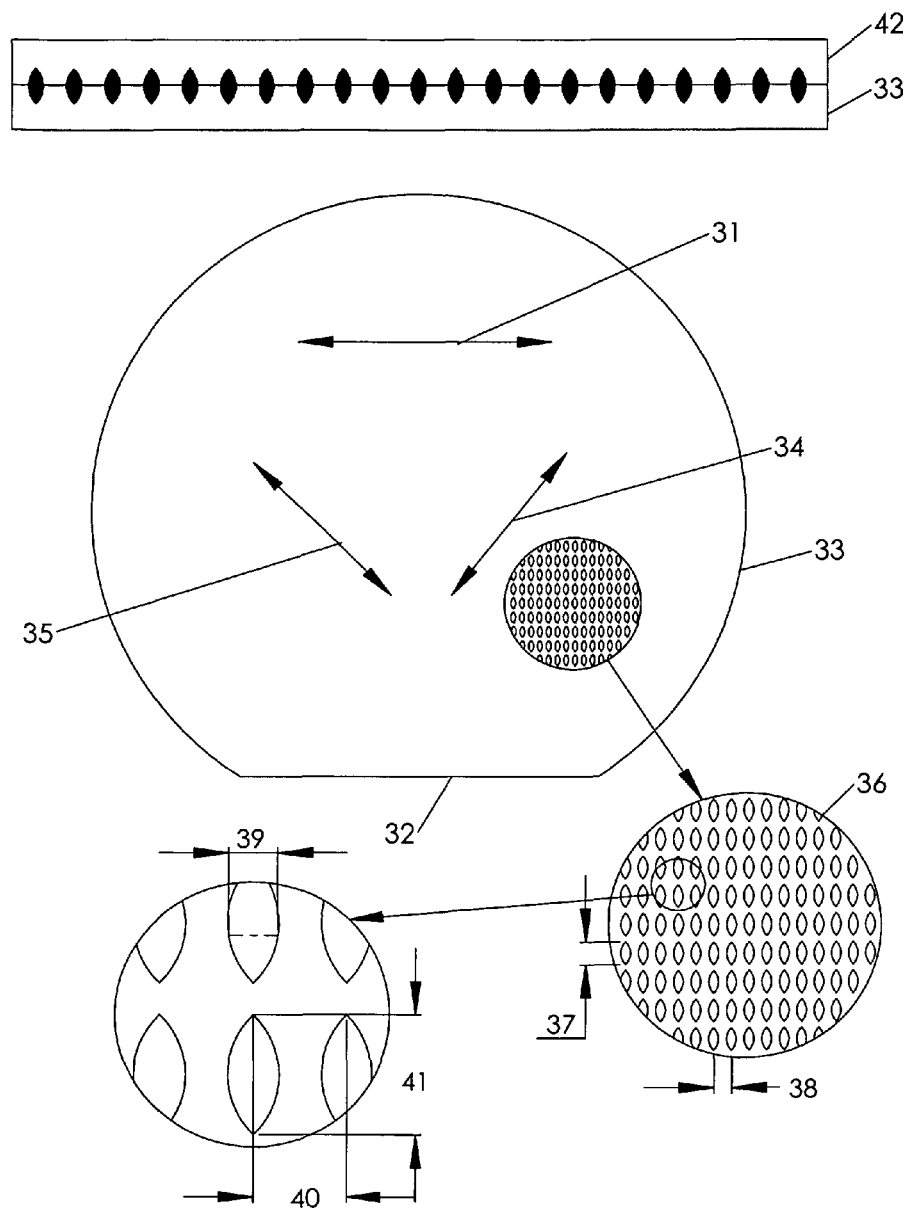
FIG. 5 depicts the geometry, spacing, direction relative to crystal planes, and depth of the stress control features of the present invention.

FIG. 5 depicts an illustration of stress control features 36 formed into wafer 33 on which a flexible freestanding epitaxial element 42 is epitaxial grown via but not limited to HYPE, MOCVD, MBE, LPE and HPHT methods as known in the art. Most preferably, flexible freestanding epitaxial element 42 is grown via HVPE due to low cost and high crystal quality. Even more preferably, flexible freestanding epitaxial element 42 is grown via HVPE with an average absorption coefficient less than 1 cm-1 over the emission range of the optoelectronic devices being formed on flexible freestanding epitaxial element 42.

The use of stress control feature 36 can enhance light extraction, suppress unwanted optical modes, reduce dislocations during subsequent regrowth as well as control flatness of flexible freestanding epitaxial element 42. Stress control features 36 may be a variety of shapes and sizes. Most preferably, a narrow line source laser is used is create a small feature size relative to the thickness of flexible freestanding epitaxial element 42. In this manner, localized stresses created at the interface between growth substrate 33 and flexible freestanding epitaxial element 42 during cutting will not exceed the fracture point of the layer. Unlike the large area excimer approaches, this approach gently fractures the interface without the need for waferbonding. The use of a narrow line source with dimensions on the order of 3 microns by 300 microns is used to create these features. The use of DPSS lasers is preferred due to the high rep rate of the pulses such that high scan rates can be used such that individual laser pulses can be used to form the stress control features 36. Typical feature sizes are depicted in the expanded view. In this case, a typical dimension for feature waist 39 is less than 10 microns, while feature length 41 is greater than 20 microns. The feature spacing 40 is typically greater than the feature waist 39. The use of alternate feature shapes and sizes as required can control flatness.

Stress control features 36 may be oriented and spaced randomly or based on a regular pattern. Alignment of surface control feature 36 to crystal planes 35, 34 or 31 are embodiments of this invention. Since the effect of stress control features 36 are additive, the use of multiple scans is an embodiment of this invention. The use of refocusing algorithms during a particular scan can deal with warpage in the initial wafer created by the lattice mismatch between growth substrate 33 and flexible freestanding epitaxial element 42. The use of mechanical means can flatten the initial wafer to deal with warpage so that the laser intensity profile at the interface between flexible freestanding epitaxial element 42 and growth substrate 33 is not changing significantly across the wafer. The edge supports can be used such that the flexible freestanding epitaxial element 42 can separate freely from growth substrate 33 during exposure. The use of porous media such as filter paper, porous ceramic, porous glass and other porous media can allow for temporary vacuum holddown of the initial wafer during laser processing. The use of laser scribing can separate flexible freestanding epitaxial element 42 either while it is attached to growth substrate 33 or after flexible freestanding epitaxial element 42 is freestanding to form shapes. Most preferably, the formation of noncircular shapes can allow for maximum utilization of equipment space in subsequent processing steps including but not limited to reactors, plasma chambers, deposition equipment, test equipment and pick and place equipment. The ability to create non-circular high quality freestanding flexible freestanding epitaxial elements 42 is a preferred embodiment of this invention. For the cases where stress control features 36 are used in both sides of flexible freestanding epitaxial element 42, the orientation of the these features to each other can be used to control the flatness or curvature of the nitride layer.

Figure 6A:
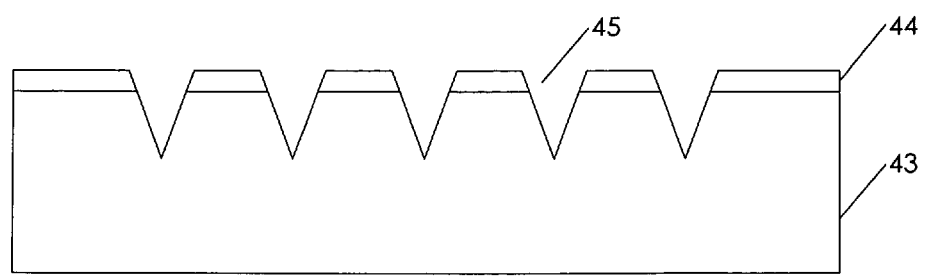
FIG. 6 depicts lateral epitaxial overgrowth based on sacrificial layers incorporated into stress control features of the present invention.

FIG. 6A depicts the formation of regrowth features in flexible freestanding epitaxial element 43. The laser cutting techniques used to create the stress control features as disclosed previously can also be used to create high aspect ratio features 45 for regrowth methods such as lateral overgrowth. Typically these features are defined by anisotropic etching of crystal planes. By using the laser scanning technique, micron sized high aspect features can be formed without the need for masking. A sacrificial layer 44 may be added to further enhance the lateral growth from these high aspect ratio features. Because etching techniques are not required, a wide range of sacrificial layer materials may be used including but not limited to silicon, SiO2, luminescent materials, metals, and transparent conductive oxides. The use of these materials and this technique to form higher crystal quality material within at least a region of the flexible freestanding epitaxial element 43 is an embodiment of this invention.

Figure 6B:
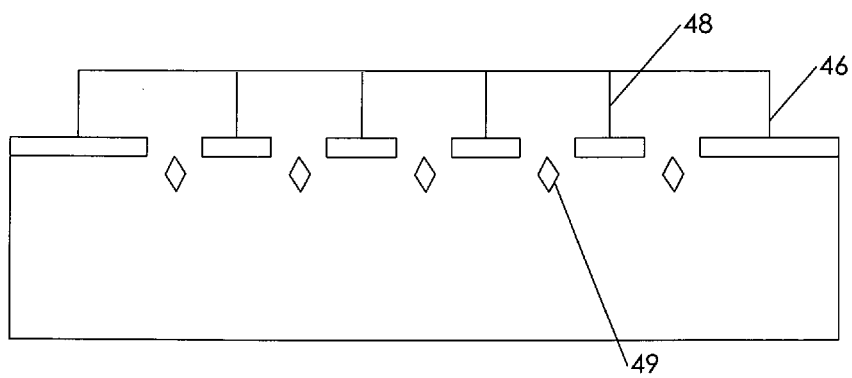
Figure 6C:
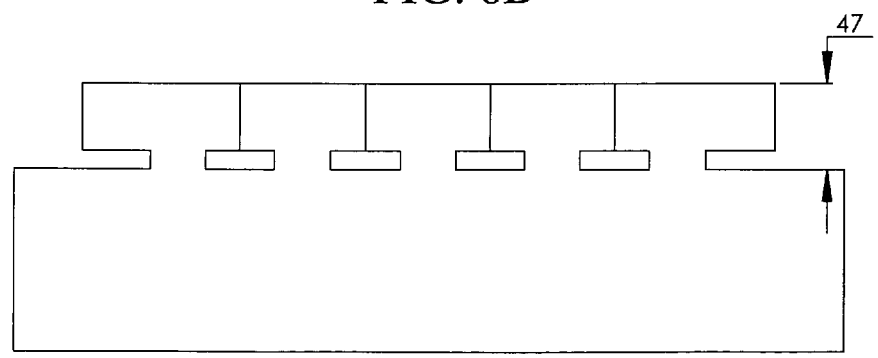

FIG. 6B depicts the typical regrowth structure 46 seen in lateral overgrowth. This typically includes coalescence regions 48 and 49. FIG. 6C depicts removal of sacrificial layer 44 and the resulting raised region 47 on flexible freestanding epitaxial element 43. In this manner, multiple levels can be formed additively on flexible freestanding epitaxial element 43 for 3 dimensional circuitry, mechanical features, and cooling channels. The use of this additive approach can create features on the flexible freestanding epitaxial element 43. Even more preferably, the use of this technique can form micro cooling features such a micro fins, microchannels, and/or increased surface area for impingement cooling techniques. The use of this technique can form mechanical features for fiber alignment, raised pedestals, self alignment features and/or interlocking features. In general the use of patterned regrowth to create features on the flexible freestanding epitaxial element 44 is an embodiment of this invention. Orientation of these features to crystal planes such that cleaving can be used to create optically smooth surfaces is also an embodiment of this invention. The use of embedded coalescence regions 49 can form channels for liquid cooling locally on flexible freestanding epitaxial element 43.

Figure 7A:
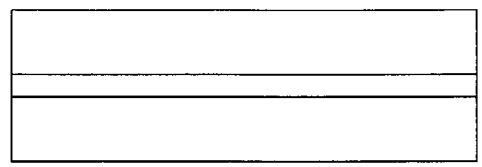
FIG. 7 depicts a thin transparent nucleation layer exhibiting non-linear response to the irradiation and its effect on the formation of the stress control feature of the present invention.
Figure 7B:
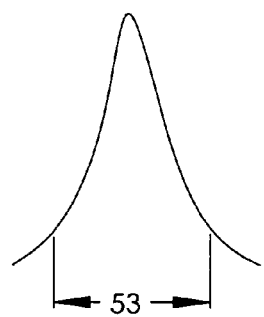
Figure 7C:
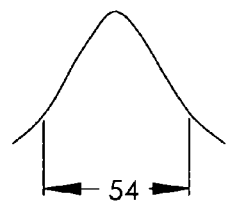
Figure 7D:
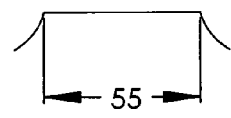

FIG. 7A depicts growth substrate 52 with nucleation layer 51 and flexible freestanding epitaxial element 50. Nucleation layer 51 is typically a region of reduced crystal quality. A variety of techniques and resulting layer characteristics are used depending on the particular supplier of these layers. GaN, AlGaN, AlN, CrN, and ZrBr2 have been reported in the literature. Some exhibit absorption to the typical laser radiation used in laser liftoff, some do not. FIGS. 7B, C, and D depict laser beam profiles with widths 53, 54, and 55 that can be used to create feature profiles. Shaping of these profiles 3 dimensionally is used to create feature shapes within the layers depicted in FIG. 7A. Preferably FIG. 7B is used for maximum cut depth in the layers.

Figure 8:
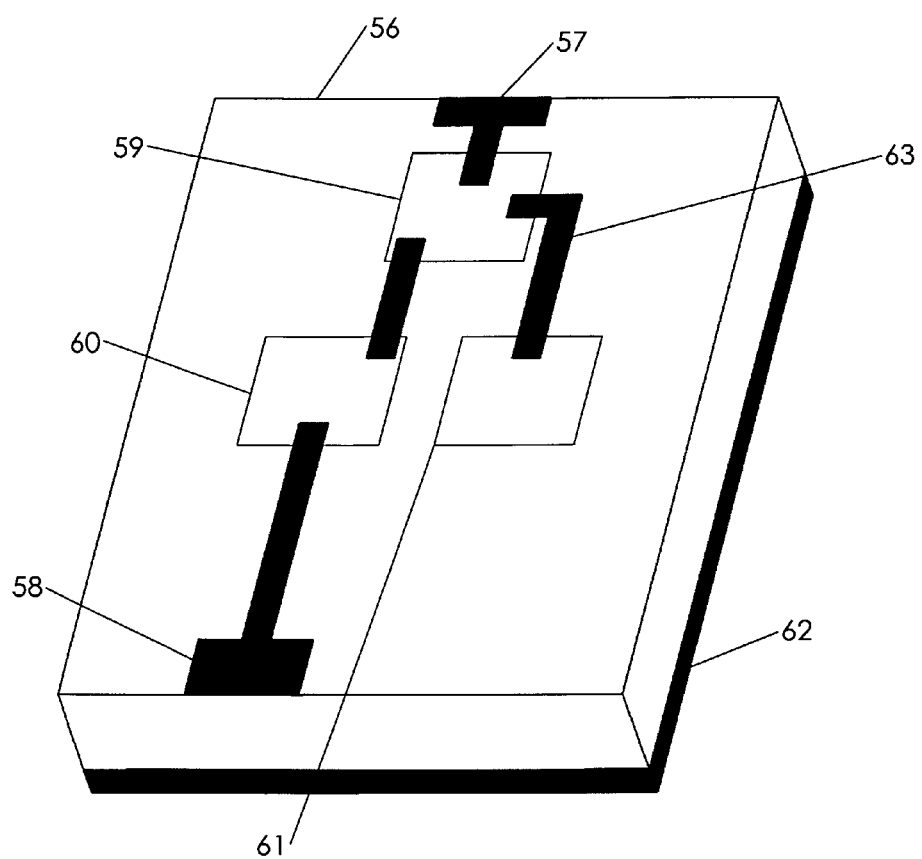
FIG. 8 depicts a single sided circuit formed on a thin flexible freestanding epitaxial element of the present invention.

FIG. 8 depicts flexible freestanding epitaxial element 56 containing devices 59, 60 and 61, electrical top contacts 57 and 58, and electrical bottom contacts 62. Devices 59, 60, and 61 may consist of, but not limited, to passive and active electrical elements such as resistors, capacitors, diodes, and transistors, optoelectronic elements such as LEDS, laser diodes, and tunable gratings, and mechanical elements like MEMS. Interconnect 63 can include metals, transparent conductive oxides and combinations of both. The use of conductive polymers is also embodiments of this invention. These devices may be integrated prior to removal of the growth substrate or once the flexible freestanding epitaxial element is freestanding. The use of doped, undoped, layered, or insulating flexible freestanding epitaxial element 56 can form at least one electrical bottom contact 62 either due to the conductive nature of the material or by the formation of via as described earlier. Devices 59, 60, and 61 can be formed on, printed on, solder onto, glued onto and/or attached via mechanical means to flexible freestanding epitaxial element 56. Top contacts 58 and 57 and bottom contact 62 may be connected to external connections via but not limited to mechanical contacts, wirebonding, flipchip, soldering, and conductive pastes.

Figure 9:
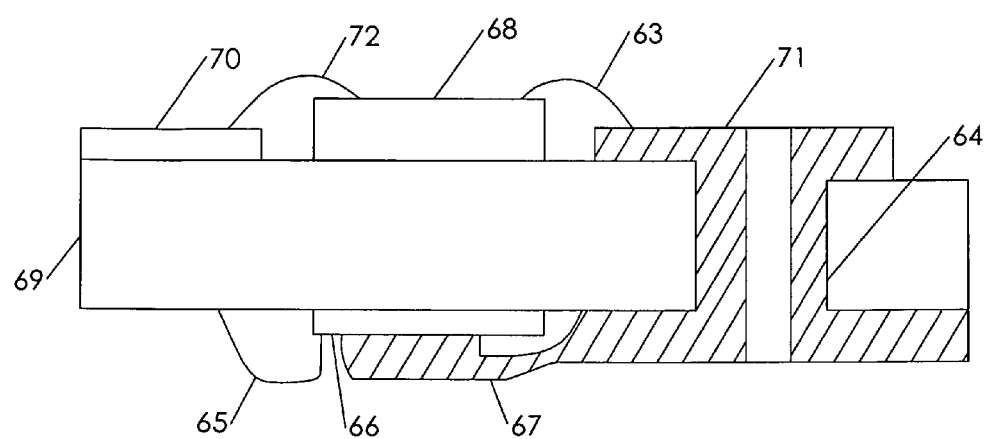
FIG. 9 depicts a double sided circuit formed on a thin flexible freestanding epitaxial element of the present invention.

FIG. 9 depicts a double sided circuit on flexible freestanding epitaxial element 69. Connection between the top and bottom of flexible freestanding epitaxial element 69 is through via 64 which may be made by, but not limited to, laser ablation, etching, drilling, and sandblasting. Device 68 is mounted adhesively to flexible freestanding epitaxial element 69 and interconnected to interconnect 70 and 71 via wirebond 63 and 72. Device 66 is formed directly on flexible freestanding epitaxial element 69 using additive processes described earlier. Passivation layer 65 is used to isolate regions of device 66 and allow for use of printed interconnect 67 to be used.

Figure 10:
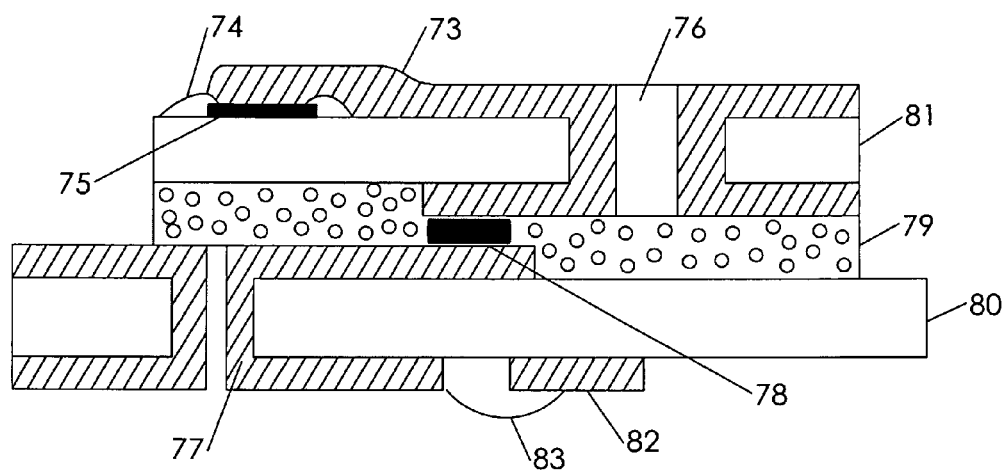
FIG. 10 depicts a multi-layer circuit formed via multiple thin flexible freestanding epitaxial elements of the present invention.

FIG. 10 depicts a multilayered assembly on flexible freestanding epitaxial elements 80 and 81. Bondply 79 is used to bond flexible freestanding epitaxial elements 80 and 81 together. Interconnect between flexible freestanding epitaxial elements 80 and 81 is via bondply contact 78 which may consist of, but not limited to, conductive inks, solder, phase change materials and mechanical contacts. Bondply 79 may consist of, but not limited to, organic and inorganic adhesives. Devices 82 and 75 are connected in a manner similar to the previous figure using interconnect means 83 and 73. Isolation means 74 may also be used to prevent shorting.

Figure 11:
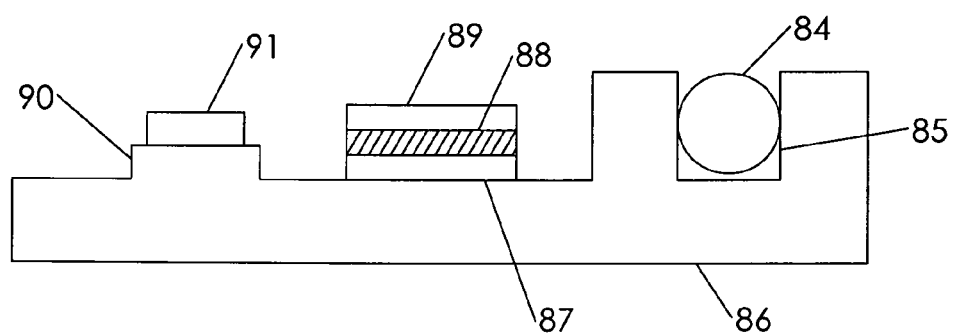
FIG. 11 depicts a 3 dimensional circuit formed on at least one thin flexible freestanding epitaxial element of the present invention.

FIG. 11 depicts 3 dimensional elements on a flexible freestanding epitaxial element 86. Alignment features position ball lens 84, while spacer 87 and bondply layer 88 are used to position crystal 89. Pedestal 90 is formed as described earlier positions laser diode 91, which was grown epitaxial directly on the pedestal 90. The use of these techniques to form 3 dimensional features in or on the flexible freestanding epitaxial element 86 is an embodiment of this invention.

Figure 12:
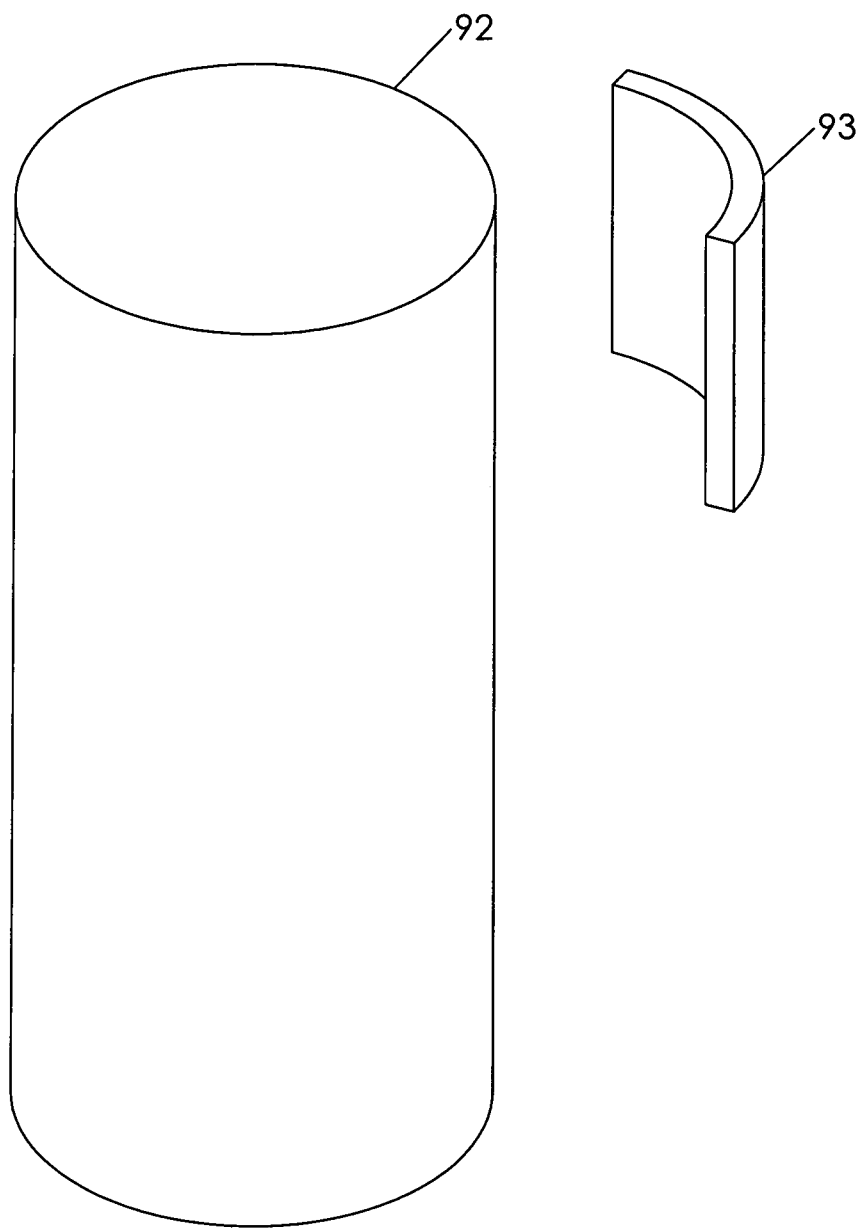
FIG. 12 depicts a thin flexible freestanding epitaxial element curved in one axis and its use with a heatpipe of the present invention.

FIG. 12 depicts cooling means 92, which may include, but is not limited to, heatpipes, conductive rods, and water pipes. Flexible freestanding epitaxial element 93 may be formed into a matching curvature using stress control features discussed earlier. The use of bonding materials including but not limited to conductive adhesives, solder, and mechanical means is an embodiment of this invention.

Figure 13:
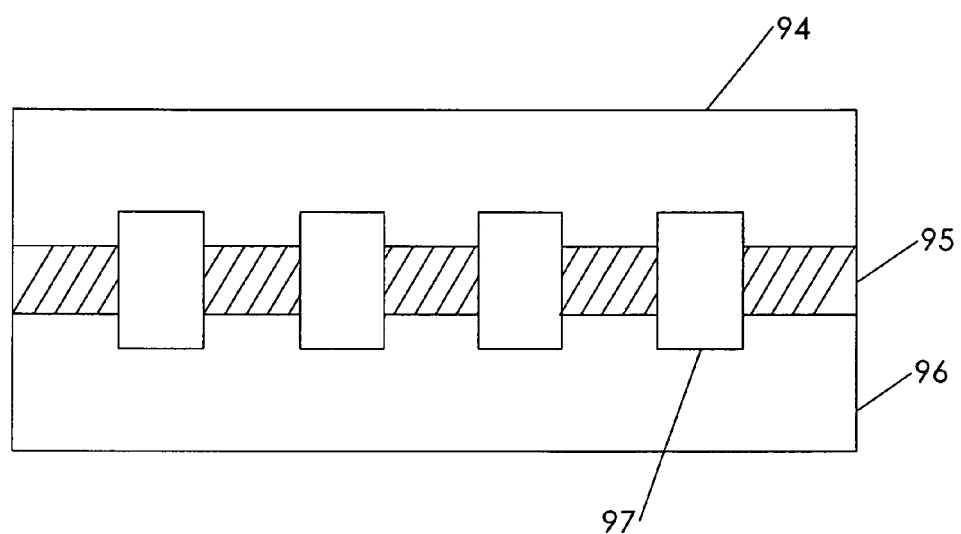
FIG. 13 depicts a multilayered circuit with integrated microchannels for cooling of the present invention.

FIG. 13 depicts flexible freestanding epitaxial elements 94 and 96, which have been textured as described earlier to form channels 97. Flexible freestanding epitaxial elements 94 and 96 are adhered together using bondply 95. The use of channels 97 to flow cooling material including, but not limited to, air and liquids is an embodiment of this invention.

Figure 14:
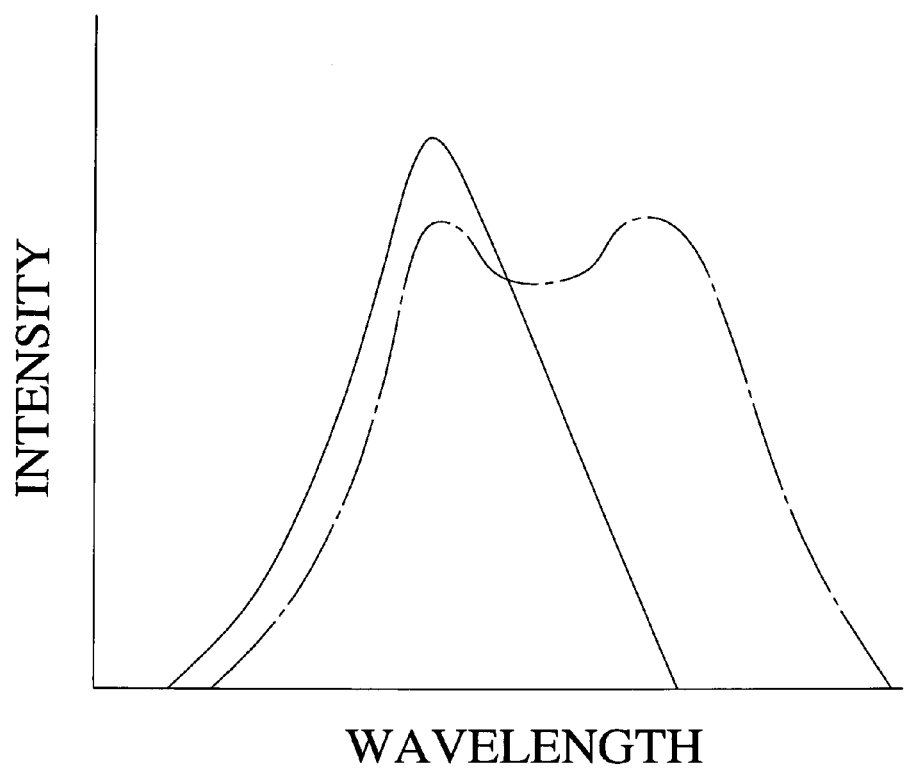
FIG. 14 depicts the spectral output of a freestanding UV led versus a mounted UV LED of the present invention.

FIG. 14 depicts the effect on the output spectrum of a UV heterojunction LED mounted 98 and unmounted 99. The die were identical with the exception of their mounting configuration. The change in spectrum is associated with the unconstrained nature of the unmounted LED. The absence of a non-native growth substrate and the lower stress nature of the flexible freestanding epitaxial element used to form this LED is believed to be the main reason for the change in spectral output between the two cases. The exact mechanism for this effect is unknown, but because nitrides are highly anisotropic, the internal piezoelectric fields within the devices are believed to play a significant role in a wide range of device performance properties, including but not limited to spectrum, current induced droop, internal quantum efficiency and voltage characteristics. This is the first demonstration of spectral splitting based on the stress experienced by the device. As such, an unconstrained nitride device is disclosed. Immersion and impingement cooling via gases and liquids as known in the art is anticipated as a means forming practical devices which are unconstrained.

Figure 15A:
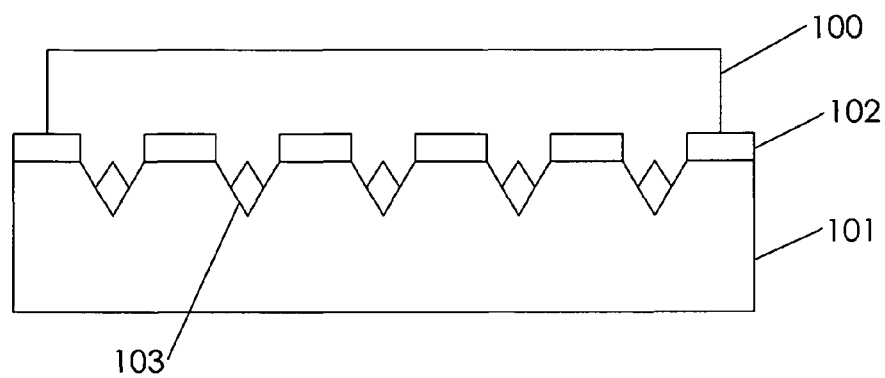
FIG. 15 depicts at least one regrowth layer on a freestanding textured thin flexible freestanding epitaxial element of the present invention.
Figure 15B:
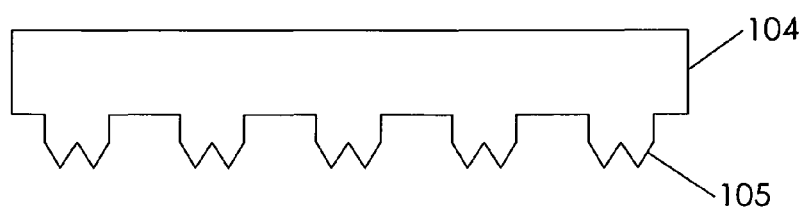

FIG. 15A depicts the regrowth of another flexible freestanding epitaxial element 100 on a flexible freestanding epitaxial element 101. The freestanding flexible nature of flexible freestanding epitaxial element 101 leads to lower stress within flexible freestanding epitaxial element 101, which in turns leads to higher crystal quality in another flexible freestanding epitaxial element 100. The use of sacrificial layer 102 can enhance lateral overgrowth as disclosed earlier. Voids 103 may be present based on the aspect ratio of the stress control features used. FIG. 15B depicts the removal of flexible freestanding epitaxial element 101 and sacrificial layer 102 to form another flexible freestanding epitaxial element 100. Separation means include, but are not limited to thermal shock, chemical etching, ultrasonics, and laser ablation. Even more preferably, the use of the resulting features 105 for optical extraction is an embodiment of this invention. In this manner a freestanding higher crystal quality flexible freestanding epitaxial element 104 can be formed. The use of this technique can form high quality AlGaN, InGaN, InN, InGaAlN, AlInN, and AlN layers. High crystal quality high indium content nitride alloys in particular are difficult to grow using conventional substrates. The improved lattice match and flexible nature of flexible freestanding epitaxial element 101 can be used to grow higher quality nitride alloys. The formation of devices including, but not limited to, LEDs, laser diodes, diodes, EELEDs, VCSELs, and semiconductor devices while another flexible freestanding epitaxial element 100 is attached to flexible freestanding epitaxial element 101 or as freestanding higher crystal quality flexible freestanding epitaxial element 104 is an embodiment of this invention.

Figure 16:
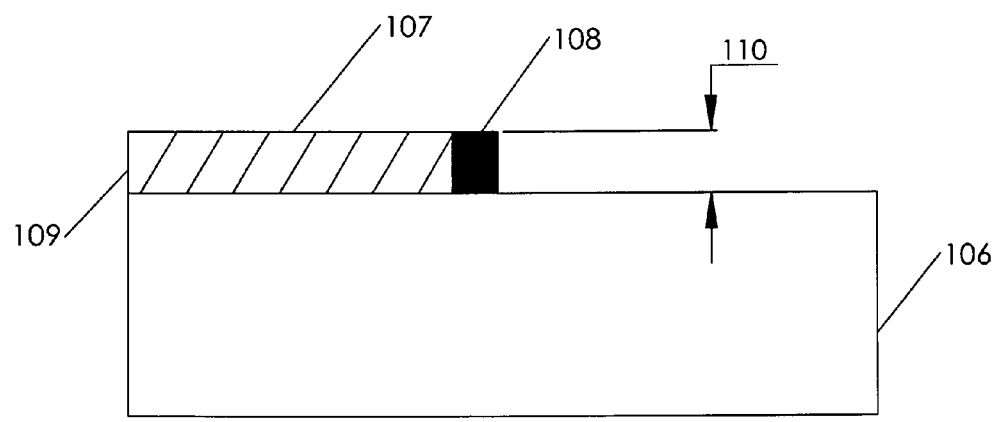
FIG. 16 depicts a laser diode with a cleaved edge formed on a thin flexible freestanding epitaxial element of the present invention.

FIG. 16 depicts the formation of a laser diode or EELED 107 in flexible freestanding epitaxial element 106. Rear reflector 108 can be deposited attached on step 110 formed as discussed earlier. Partial minor 109 is formed by cleaving flexible freestanding epitaxial element 106. The use of subsequent coatings can enhance the reflectivity of partial mirror 109. The optical transparency of nitrides and the use of alloys creates confinement channels as known in the art. Higher crystal quality regions are formed on the flexible freestanding epitaxial element 106 due to regrowth, reduced stress, and homoepitaxial growth. The absence of thermal boundary layers using this approach is also an embodiment of this invention. Thermal conductivity is enhanced with this approach.

Figure 17:
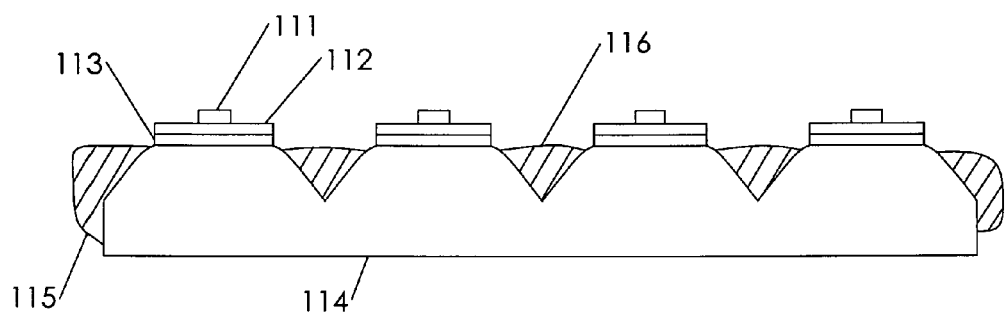
FIG. 17 depicts an array of LEDs formed on a thin flexible freestanding epitaxial element of the present invention.

FIG. 17 depicts an array LEDs or VCSELs formed on flexible freestanding epitaxial element 114. In the case of LEDs top metal contact 111, top contact layer 112, active region 113 are isolated via mesa formation which may be formed via but not limited to lithography and etching means, laser patterning and mechanical scribing. The use of laser patterning is preferred. For large area arrays current spreading layers 116 may be used. This embedded grid work of metals contacts can be connected to outer contact 115 by forming a grid pattern that extends outward to perimeter of flexible freestanding epitaxial element 114. The use of electroplating can form current spreading layer 116.

Figure 18:
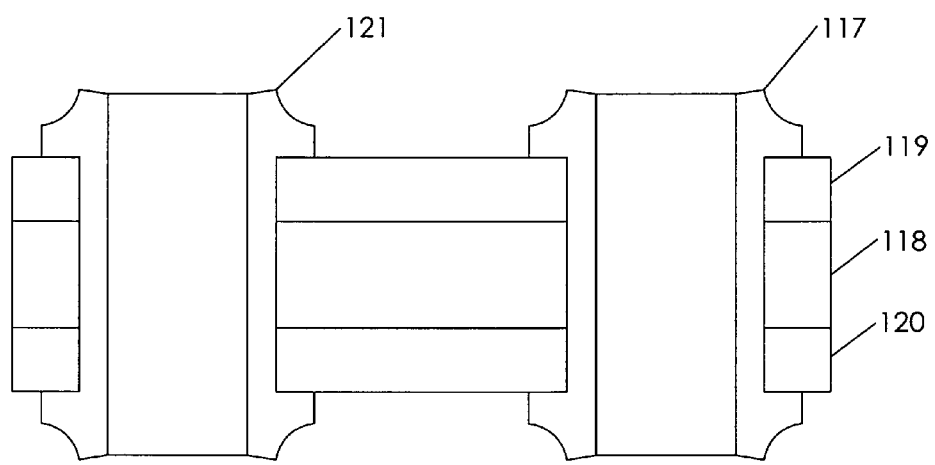
FIG. 18 depicts a solar cell and light source formed on two sides of a thin flexible freestanding epitaxial element of the present invention.

FIG. 18 depicts a solar cell layer 119 deposited, adhesively attached, soldered, grown, or mechanically fastened to flexible freestanding epitaxial element 118. The other side of nitride 118 is LED layer 120 which is deposited, adhesively attached, soldered, grown or mechanically fastened to flexible freestanding epitaxial element 118. Charge created by irradiation of solar cell layer 119 is transferred via feedthrus 121 and 117. The formation of additional elements in flexible freestanding epitaxial element 118 can store, convert, monitor, and block the charge from solar cell layer 119 to LED layer 120.

Figure 19A:
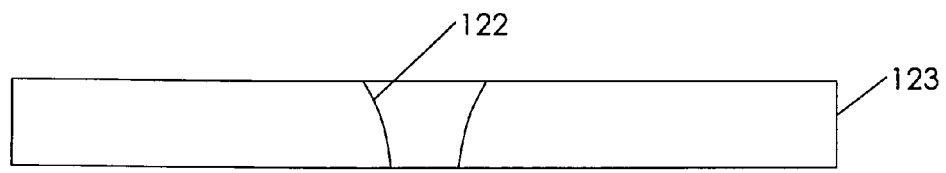
FIG. 19 depicts laser cut vias formed in a thin flexible freestanding epitaxial element of the present invention.
Figure 19B:
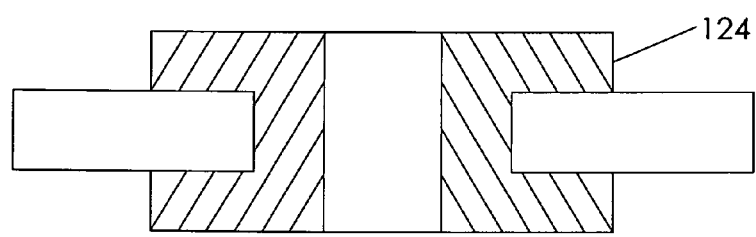
Figure 19C:
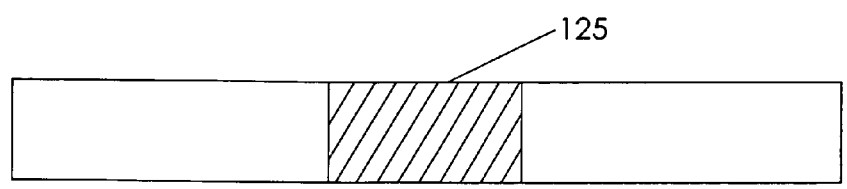

FIG. 19 depicts at least one laser cut via 122 in flexible freestanding epitaxial element 123. In this case the ability to form thin freestanding flexible freestanding epitaxial element 123 enables the use of this technique. Typical high resolution laser processing is limited to less than a couple hundred microns for reasonable power levels. The ability to form flexible freestanding epitaxial element 123 for laser drilling less the 200 microns in thickness is an embodiment of this invention. Contact means 124 and 125 can include, but not limited to, plated holes, conductive inks filled holes, and solder filled holes. The use of solder bump, gold bumping, and compressive contacts is also an embodiment of this invention.

Figure 20:
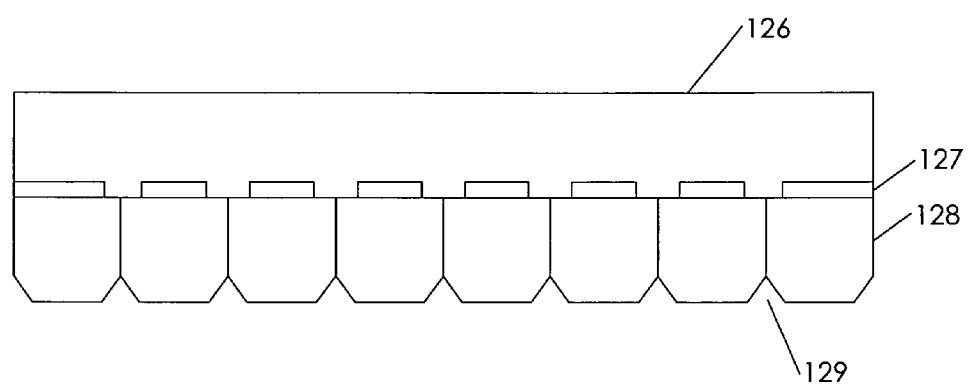
FIG. 20 depicts of an array of cleaved flexible freestanding epitaxial elements with regrowth of the present invention.

FIG. 20 depicts the use of cleaved interfaces for regrowth. Regrowth layer 126 is grown on cleaved array 128 formed from a freestanding nitride layer. Laser scribes 129 are created in the flexible freestanding epitaxial element and mechanical, thermal, optical means are used to separate the individual elements forming cleaved array 128. The optional use of sacrificial layer 127 consists of a material which does not promote crystal growth such as, but not limited to, SiO2, Si3N4, and other materials capable of handling the growth conditions. The use of separation techniques to separate the cleaved elements in cleaved array 128 is also disclosed. In this manner, regrowth can occur off high quality high aspect ratio surface leading to improved crystal quality in regrowth layer 126. Using this approach high quality non-polar flexible freestanding epitaxial elements can be formed.

Figure 21:
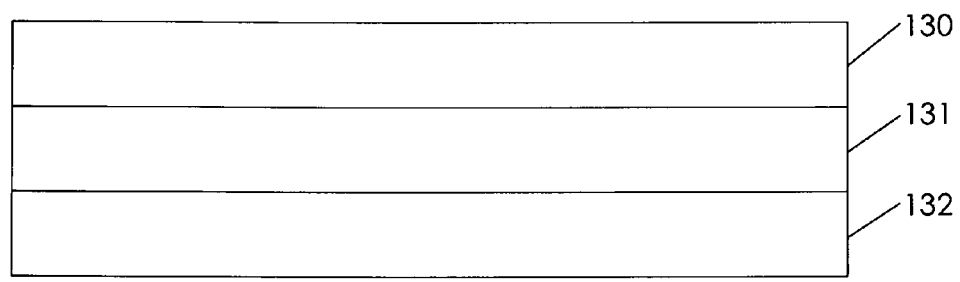
FIG. 21 depicts the lamination of at least two thin flexible freestanding epitaxial elements together of the present invention.

FIG. 21 depicts a laminated stack of at least two flexible freestanding epitaxial elements. Top flexible freestanding epitaxial element 130 and bottom flexible freestanding epitaxial element 132 are bonded together using bonding layer 131. Bonding layer 131 may include, but not limited to, organic and inorganic adhesives, metals, and other bonding materials. The use of stress control features as discussed previously can induce a particular stress pattern in either and/or both layers. The use of this assembly with appropriate electroding can form a bimorph. The use of a single layer with appropriate electroding can form a unimorph. The use of these actuators in biological applications is a preferred embodiment of this invention. The formation of features in the bonding layer 131 or the top flexible freestanding epitaxial element 130 and/or bottom flexible freestanding epitaxial element 132 can create microfluidic actuators. The formation of these features using laser ablation, lithography and chemical etching, and mechanical means is also an embodiment.

Figure 22:
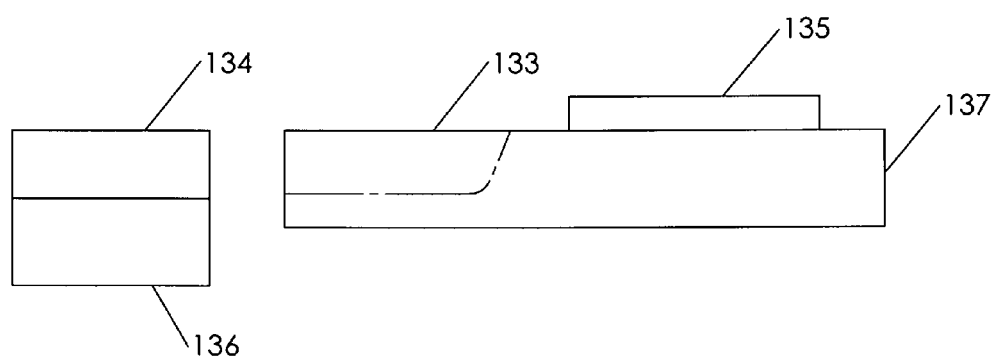
FIG. 22 depicts at least one laser diode and at least one control element built in a flexible freestanding epitaxial element and its use as an optical interconnect of the present invention.

FIG. 22 depicts a flexible freestanding epitaxial element 137 containing at least one laser diode 133 and control circuit 135 contained within flexible freestanding epitaxial element 137. The unique capability of the high crystal quality flexible freestanding epitaxial element 137 enables the formation of both types of devices in a single layer. The cleaveable nature of the freestanding flexible freestanding epitaxial element 137 and its use can form the exit surface for at least one laser diode 133. This combined element can be coupled to optical waveguide 134 in optical interconnect 136. The formation of alignment features within flexible freestanding epitaxial element 137 as previously disclosed can facilitate alignment of optical waveguide 134 to the output of at least one laser diode 133.

Figure 23:
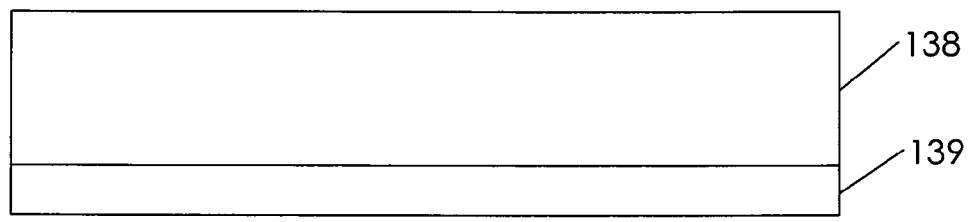
FIG. 23 depicts flexible freestanding epitaxial element with a contact on one side of the present invention.

FIG. 23 depicts at least one flexible freestanding epitaxial element 138 with a contact layer 139. The contact layer 139 may consist of, but not limited to, Omni Directional Reflector (ODR) which is diffuse, specular, and/or contains electrical interconnect means, reflective metal which does or does not form ohmic contact to the nitride layer, printed conductor, adhesive layer, and optical element including, but not limited to, wire grid polarizer, photonic crystal, microoptical element, and/or dichroic element. The article contains at least one flexible freestanding epitaxial element 138 and at least one type of contact layer 139. The use of contact layer 139 can adhere, extract light from, make electrical and/or mechanical contact to and induce a charge on flexible freestanding epitaxial element 138.

Figure 24A:
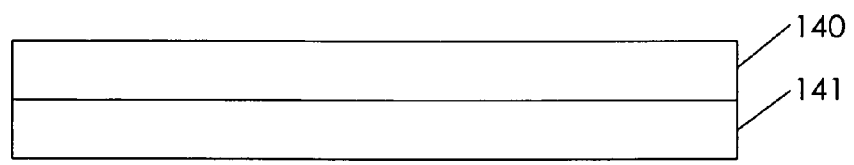
FIG. 24 depicts a large area diode formed using n doped and p doped flexible freestanding epitaxial elements of the present invention.
Figure 24B:
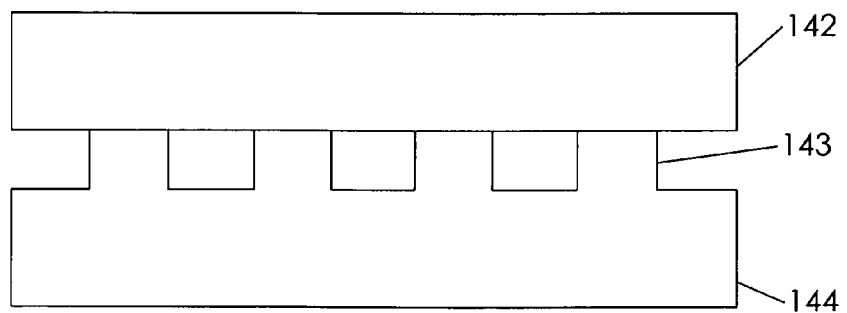

FIG. 24A depicts a large area diode formed by joining first flexible freestanding epitaxial element 140 to second flexible freestanding epitaxial element 141. As known in the art, large area diodes can be formed by waferbonding p and n type materials together. The use of thin flexible freestanding epitaxial elements can form these types of devices. FIG. 24B depicts the use of first flexible freestanding epitaxial element 142 joined to second flexible freestanding epitaxial element 144 containing features 143 which may be formed by regrowth means described previously. The purpose of this approach is to facilitate improved bonding by allowing for the removal of trapped gases. These approaches are embodiments of this invention.

Figure 25:
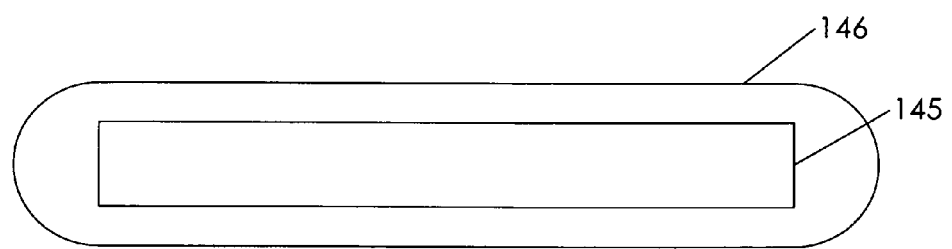
FIG. 25 depicts a flexible freestanding epitaxial element with encapsulating regrowth of the present invention.

FIG. 25 depicts at least one flexible freestanding epitaxial element 145 where substantially the entire at least one flexible freestanding epitaxial element 145 is encapsulated with coating 146. Coating 146 may include but not limited to amorphous coatings, epitaxial coatings, and metallic coatings. More preferably, coating 146 may consist of glasses, HVPE nitride regrowths, bio active coatings, pharmaceutical coatings and electrically conductive coatings. The use of epitaxial growth methods such as LPE, MBE, MOCVD, HVPE, and other epitaxial methods is an embodiment of this invention. Physical deposition methods include, but are not limited to, spraying, dipcoating, evaporation, sputtering, laser ablation, flame spraying, transfer coating, and lamination. The articles formed using this approach are heatsinks, drug delivery systems, RFID tags, epiwafers, and/or actuators. The use of at least one flexible freestanding epitaxial element 145 containing optical, optoelectronic, MEMs, and electrical elements along with this encapsulation technique is an embodiment of this invention.

Figure 26:
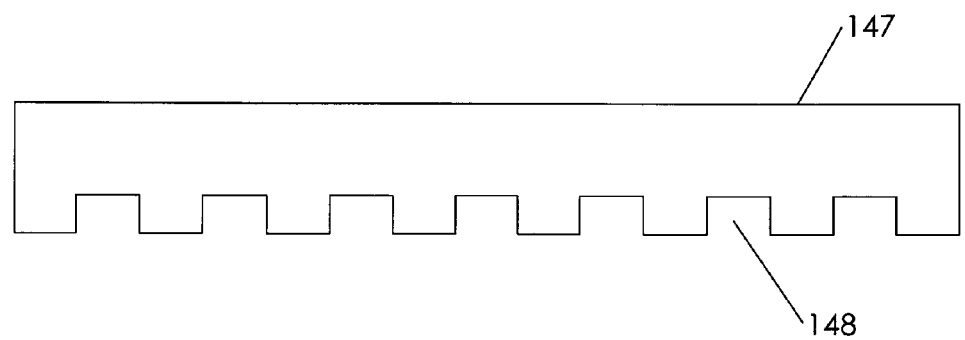
FIG. 26 depicts a large area LED on a flexible freestanding epitaxial element with microchannels on one side of the present invention.

FIG. 26 depicts at least one flexible freestanding epitaxial element 147 containing microchannels 148. These microchannels may be formed by, but not limited to, laser etching, etching process, and/or mechanical means. These channels can be used for cooling either as passageways for the cooling media or increased surface area, microfluidic channels, wells for drug and/or bio-active materials, and mounting features for additional devices to be mounted.

Figure 27:
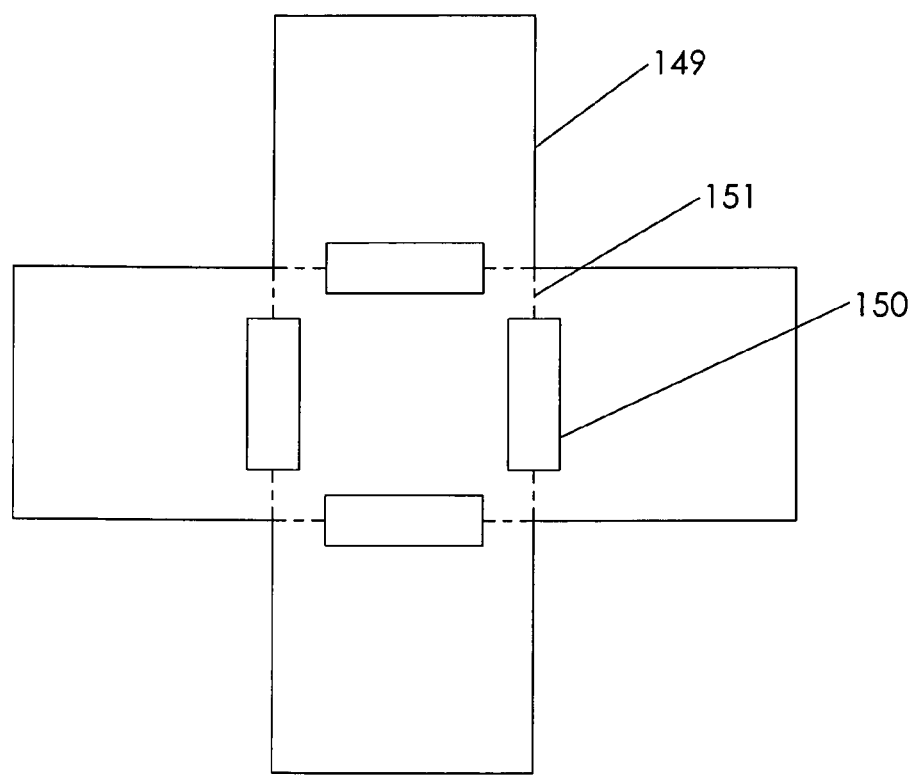
FIG. 27 depicts a foldable 3 dimensional LED based on a flexible freestanding epitaxial element with hinges of the present invention.

FIG. 27 depicts a foldable flexible freestanding epitaxial element 149 containing at least one hinge 150 and one foldline 151. The hinge 150 may be, but not limited to, metal, polymer, or other flexible element. The hinge 150 may provide electrical connection or act as an insulator between the segments of foldable flexible freestanding epitaxial element 149 across foldline 151. The use of laser scribing, etching, and mechanical means can create foldline 151. Both the unfolded and folded article created using this technique is an embodiment of this invention.

Figure 28A:
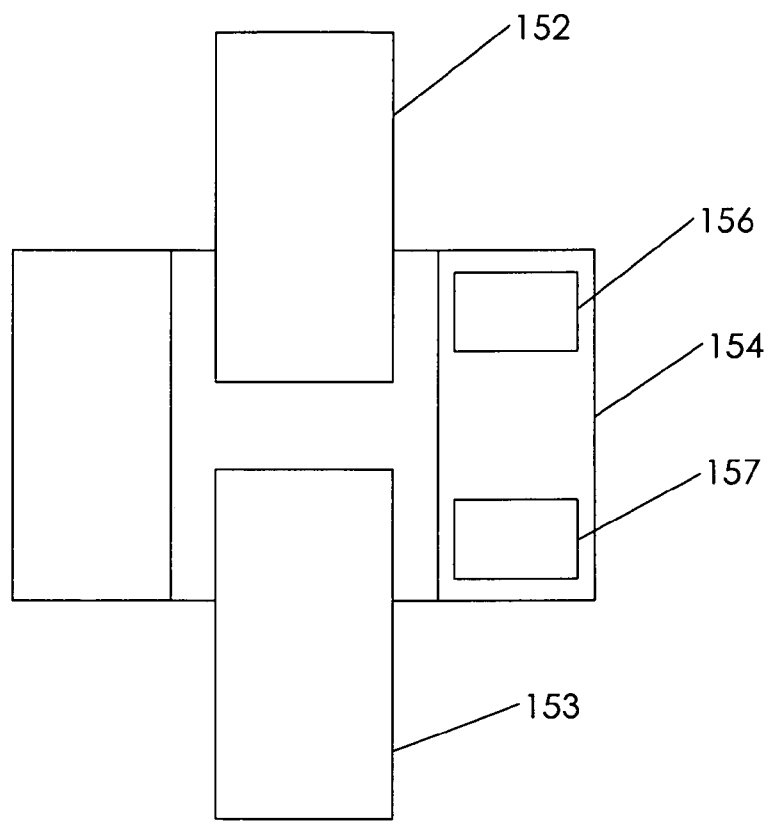
FIG. 28 depicts a flexible freestanding epitaxial element with an alignment feature for coupling at least two optical fibers of the present invention.
Figure 28B:
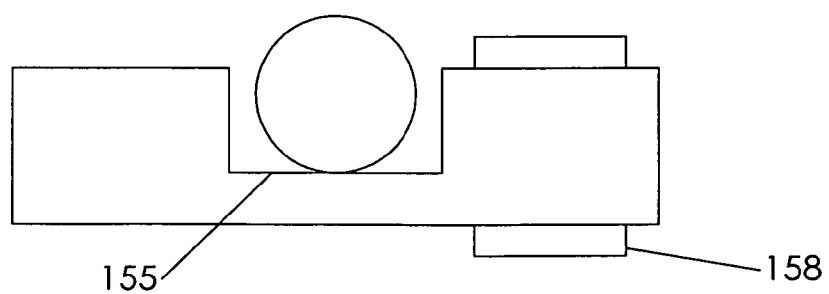

FIG. 28 depicts two fibers 152 and 153 in alignment groove 155 formed in flexible freestanding epitaxial element 154. Electrodes 156, 157 and 158 are formed onto flexible freestanding epitaxial element 154 and are used to apply current to flexible freestanding epitaxial element 154. The use of previously disclosed piezoelectric elements may be incorporated into the approach to allow for active alignment of fibers, optical elements and electrical contacts.

Figure 29:
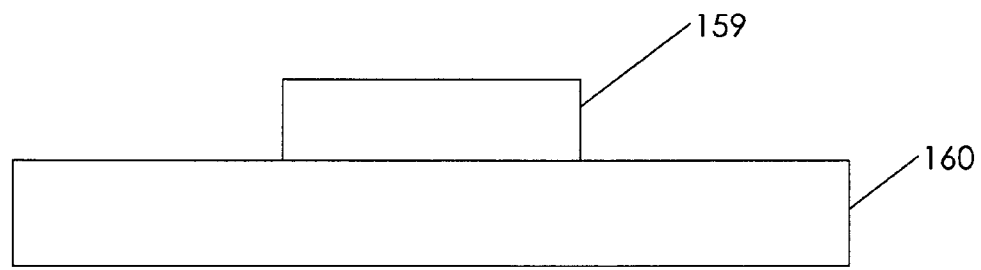
FIG. 29 depicts a flexible freestanding epitaxial element as a heatspreader of the present invention.

FIG. 29 depicts the use of flexible freestanding epitaxial element 160 as a heatspreading layer for heat source 159. More preferably, the flexible freestanding epitaxial element 160 would have a thermal conductivity of greater than 200 W/m/K along the c axis with a thermal expansion at room temperature less than 4 ppm. Alternately, a plane flexible freestanding epitaxial element 160 may be used for heatsource 159 to allow for thermal matches to higher expansion heatsource 159 with a thermal conductivity greater than 150 W/m/K and a thermal expansion at room temperature greater than 4 ppm. In this manner, high powered heat sources 159 can be cooled with a matching thermal expansion coefficient using different crystal orientations for flexible freestanding epitaxial element 160. The use of previously disclosed techniques to remove the heat from the heatspreading layer is also an embodiment of this invention.

Figure 30:
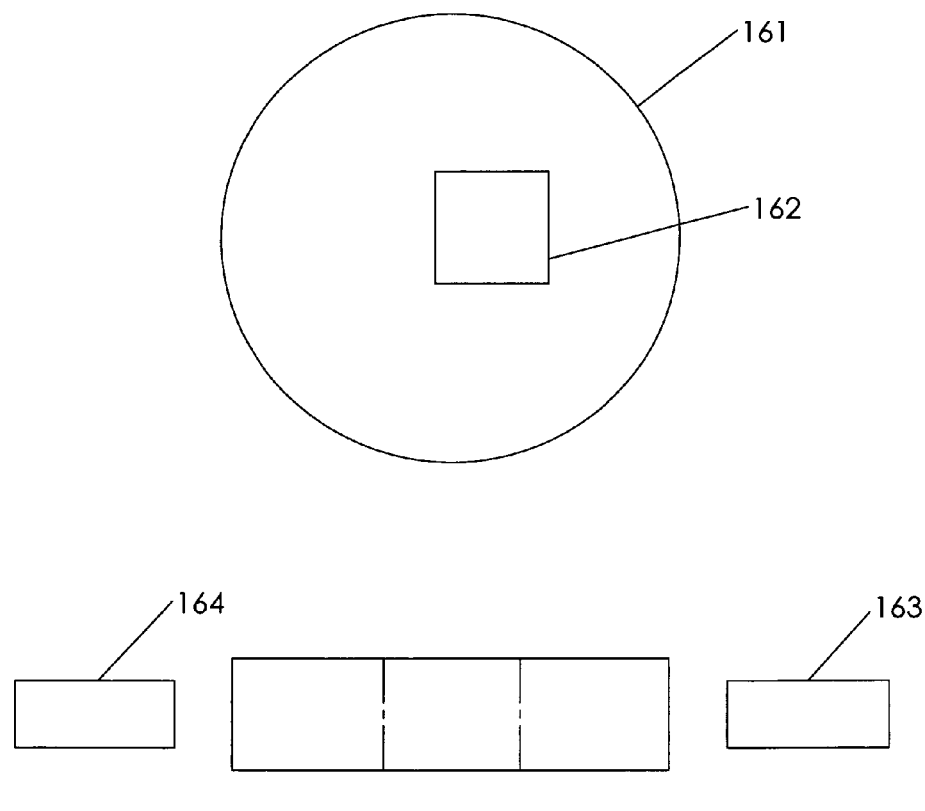
FIG. 30 depicts a flexible freestanding epitaxial element as a gasket of the present invention.

FIG. 30 depicts a flexible freestanding epitaxial element 161 with a feature 162 cut preferably by, but not limited to, laser machining, chemical etching and mechanical means. The use of laser machining is a preferred embodiment of this invention. The combination of the thinness of flexible freestanding epitaxial element 161 and ease with which it can be laser machined due to conversion of the GaN to Gallium and nitrogen enables the formation of complex features for use as but not limited to filters, gaskets, spring washers, and other mechanical flat parts that require high temperature, chemical resistance, and/or biocompatibility. More preferably, the use of these elements as optically clear elements through which optical sensing can be done as depicted in FIG. 30 where light source 163 is coupled into the edge of flexible freestanding epitaxial element 162 such that the material being passed through the feature 162 is exposed to the emitted light from light source 163 recoupled into flexible freestanding epitaxial element 162 and then detected by the detector 164. The optical transmittance of the flexible freestanding epitaxial element extends from the deep UV down through the IR wavelength range. The integration of either and/or both the light source 163 and the detector 164 into the flexible freestanding epitaxial element is an embodiment of this invention.

Figure 31:
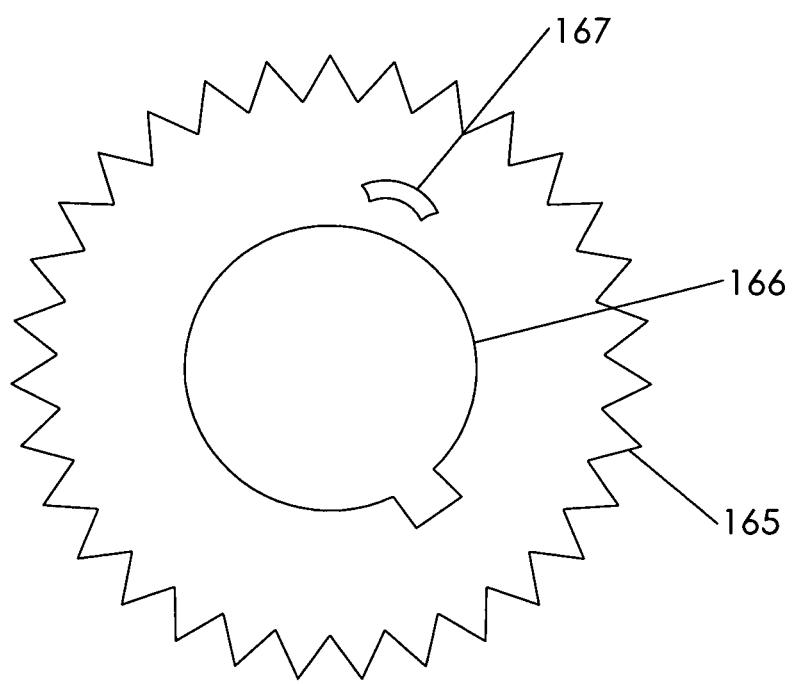
FIG. 31 depicts a flexible freestanding epitaxial element laser cut to form a gear of the present invention.

FIG. 31 depicts a flexible freestanding epitaxial element 165 cut into a gear. A variety of inner features 166 are possible including, but not limited to, holes, keyed holes, non-circular features, and slots. The inclusion of a strain gauge 167 can be either created in the flexible freestanding epitaxial element 165 or attached to flexible freestanding epitaxial element 165.

Figure 32:
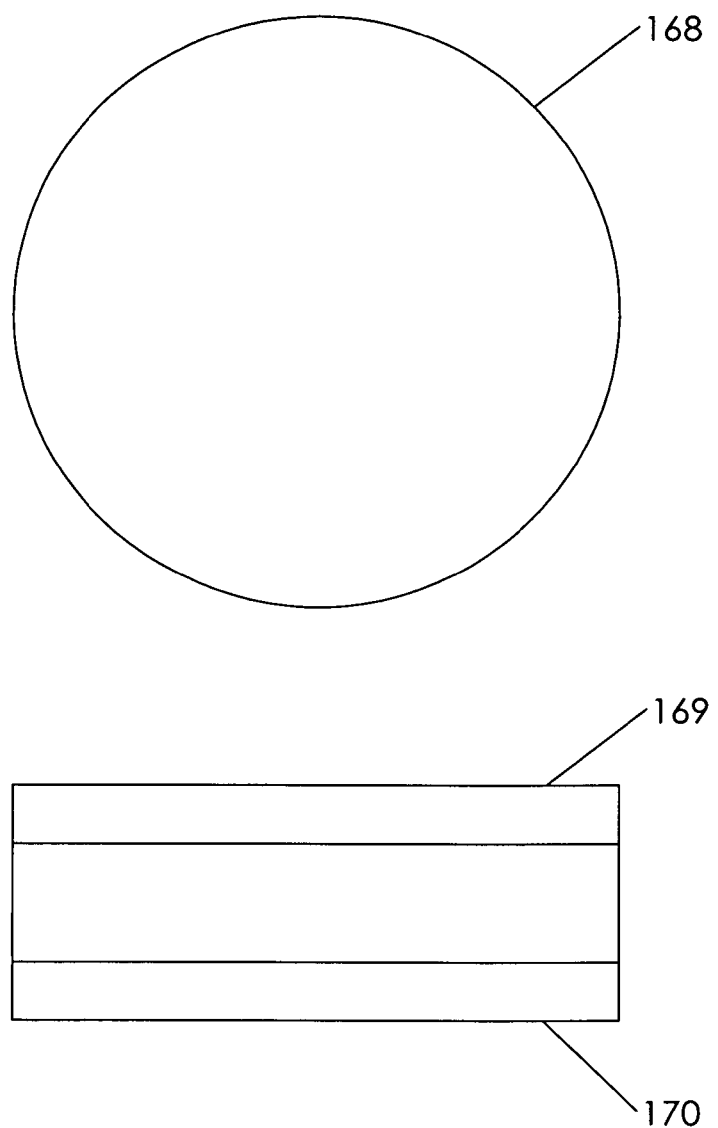
FIG. 32 depicts a flexible freestanding epitaxial element as an optical window of the present invention.

FIG. 32 depicts a flexible freestanding epitaxial element 168 forming an optical element. By adjusting the alloy composition of the flexible freestanding epitaxial element 168, a highly selective adjustable UV absorbing filter can be formed. The range of adjustment can be from 6.0 ev for AlN down to 0.7 ev for InN with any bandedge in between. Additionally, the tailored absorption spectrums can be created using additional layers 169 and 170 on one or both surfaces of flexible freestanding epitaxial element 168. Additional layers 169 and 170 may also include but not limited to dichroic coatings, polarization layers, birefringent layers, photonic crystals structures, subwavelength structures, cladding layers, and luminescent layers. The introduction of luminescent species or elements in the flexible freestanding epitaxial element 168, and/or additional layers 169 and 170 can cause wavelength conversion and/or gain media. The use of this element to create a gain cavity for a laser is also an embodiment of this invention. More preferably, the formation of a gain cavity based on doping elements within the flexible freestanding epitaxial element 168 and the formation of the cavity by at least one surface of the flexible freestanding epitaxial element 168 being cleaved along a crystal plane is an embodiment. In these cases, most preferred is the use of these techniques within the wavelength ranges where the absorption coefficient alpha is below 1 cm.sup.-1.

Figure 33:
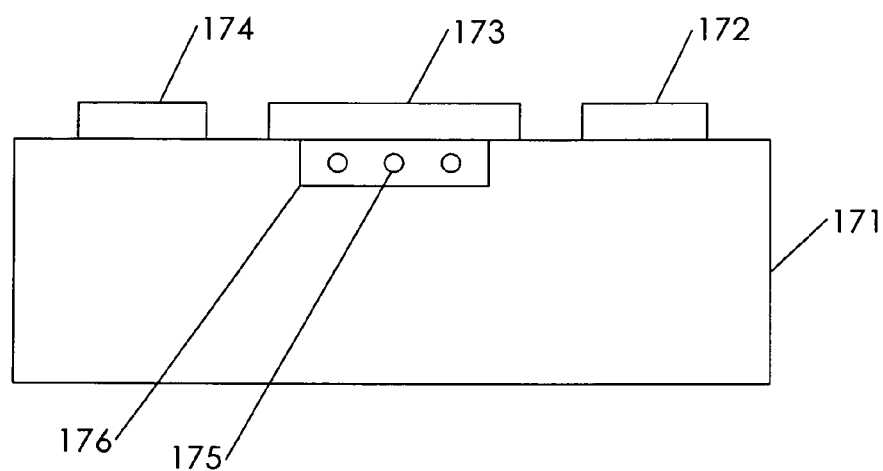
FIG. 33 depicts a flexible freestanding epitaxial element with at least one pocket cut into it surface containing a drug and a dissolvable overcoat of the present invention.

FIG. 33 depicts a flexible freestanding epitaxial element 171 in which at least one pocket 176 is formed which contains at least one drug 175 to be delivered internal to the body. The delivery of at least one drug 175 to be determined by rupture of cover 173 either via the solubility of cover 173 or via induced means created by circuit elements 172 and 174. Most preferably these elements are created directly within flexible freestanding epitaxial element 171 and may include, but not limited to, receivers, charge storage elements, piezoelectric actuators, antennas, and optical absorbers. The intent being to create an element which would only deliver the drug upon activation once the target tumor or body part was in proximity to the nitride layer. The benefit of this approach is that nitrides can make a wide range of optically and electrically active elements while still being biocompatible.

Figure 34:
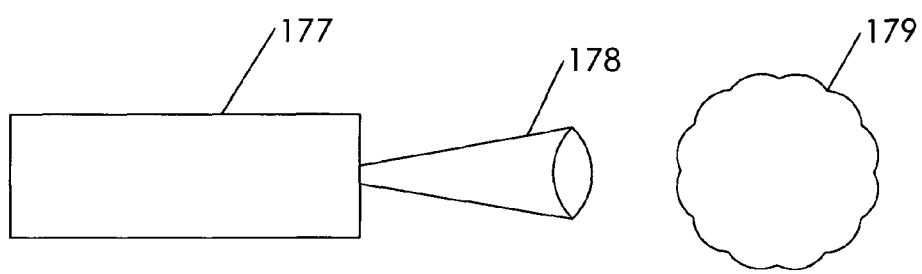
FIG. 34 depicts a flexible freestanding epitaxial element for an implantable laser source for localized therapy of the present invention.

FIG. 34 depicts an implantable laser therapy device 177 created using a freestanding flexible freestanding epitaxial element as described above. The laser, controller and receiver can be created within a freestanding nitride layer. More preferably the approach and device can generate radiation 178 that is implantable. Even more preferably this approach can generate radiation between 10 microns and 200 nm in wavelength. Most preferable is the use of this approach to locally radiate a target including but not limited to a tumor, ligament, muscle, or other body part 179. The implantable laser therapy device 177 may be injected, surgically implanted, swallowed or located within a body opening. The use of externally coupled radiation can excite the emitting source internal to the body. The implantable laser therapy device 177 may be temporarily or permanently implanted. The use of VCSEL, EELED, laser diode, and LED sources in this device is an embodiment of this invention. The use of the flexible freestanding epitaxial element can couple light from the emitter into a directional or isotropic pattern from the emitter.

Figure 35:
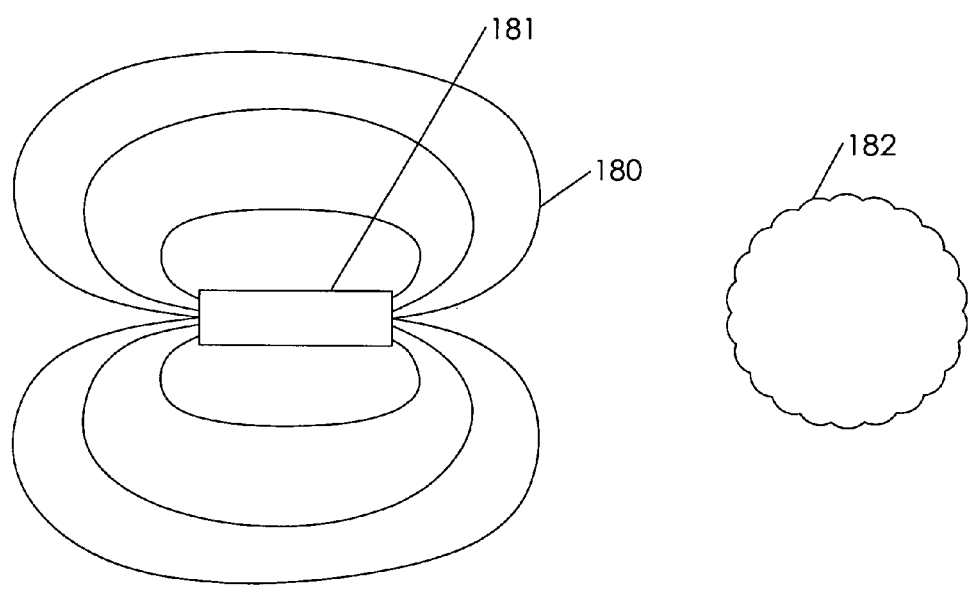
FIG. 35 depicts an implantable high frequency source on a flexible freestanding epitaxial element for tumor therapy of the present invention.

FIG. 35 depicts an implantable radiation therapy device 181 created using a freestanding flexible freestanding epitaxial element as described above. The emitter, controller and receiver can be created within a freestanding nitride layer. More preferably the approach and device can generate radiation 180 that is implantable. Even more preferably, this approach can generate radiation between 1 Ghz in frequency and 10 microns in wavelength. Most preferable is the use of this approach to locally radiate a target including but not limited to a tumor, ligament, muscle, or other body part 182. The implantable radiation therapy device 181 may be injected, surgically implanted, swallowed or located within a body opening. The use of externally coupled radiation can excite the radiation source internal to the body. The implantable radiation therapy device 181 may be temporarily or permanently implanted. The use of implantable radiation therapy devices 181 emitting within the terahertz range for gene therapy is an embodiment of this invention.

Figure 36:
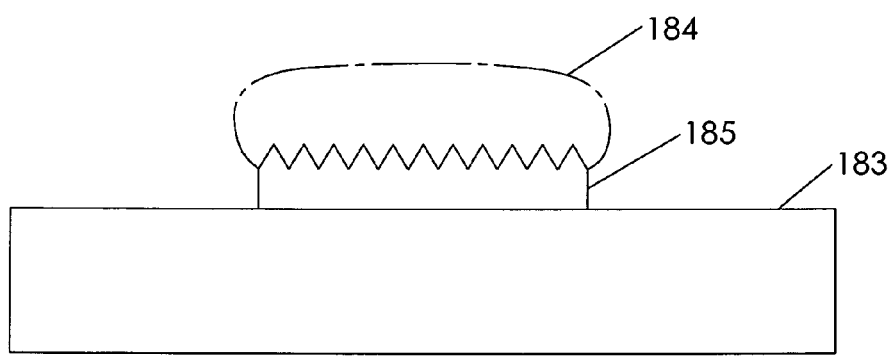
FIG. 36 depicts a biocompatible surface on a epitaxial element formed on a flexible freestanding epitaxial element of the present invention.

FIG. 36 depicts a flexible freestanding epitaxial element 183 containing at least one semiconducting element 185 to which a biological species 184 is in contact. This device takes advantage of the biocompatibility of the nitrides. Stimulation from device grown on the flexible freestanding epitaxial element 183 using electrical, optical, or magnetic radiation can enhance cellular growth and/or attachment. Formation of surface textures conducive to cellular attachment is also an embodiment of this invention. The intent of this embodiment is to form a bio-compatible interface to biological species 184 for control, destruction, detection, and modification of the biological species 184.

Figure 37A:
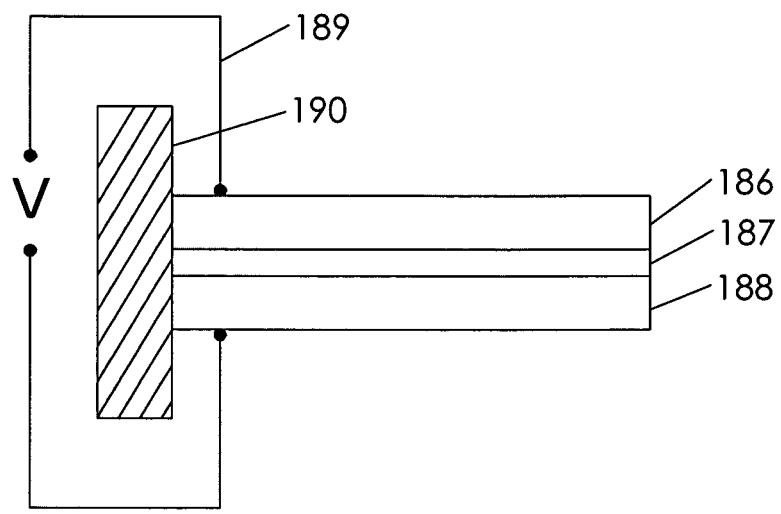
FIG. 37 depicts a bimorph formed by laminating two flexible freestanding epitaxial elements together of the present invention.
Figure 37B:
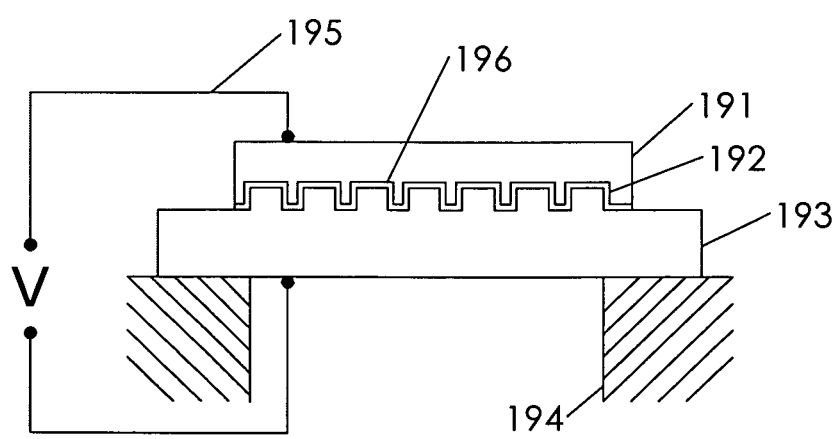

FIG. 37A depicts a bimorph contain at least one flexible freestanding epitaxial element 186 created using the techniques described previously. At least one flexible freestanding epitaxial element 186 is bonded to second layer 188 using bonding layer 187. Second layer 188 may consist of another piezoelectric layer including, but not limited to, nitrides, oxides, diamond, metals, and other high stiffness materials. Actuation occurs via electrical contacts 189. The support 190 constrains the bimorph on at least one end. FIG. 37B depicts a bimorph constrained on both ends by support 194. Flexible freestanding epitaxial element 193 and bonding layer 192 along with second layer 191 form the bimorph. Actuation occurs via electrical connections 195. The use of high Al content nitrides is preferred. The formation of surface features 196 as discussed previously can enhance displacement, create an adjustable grating, or form a microfluidic pump element. The use of patterned regrowth can create patterned regions of high Al content nitrides. The use of arrays of bimorphs can form a spatial light modulator.

Figure 38:
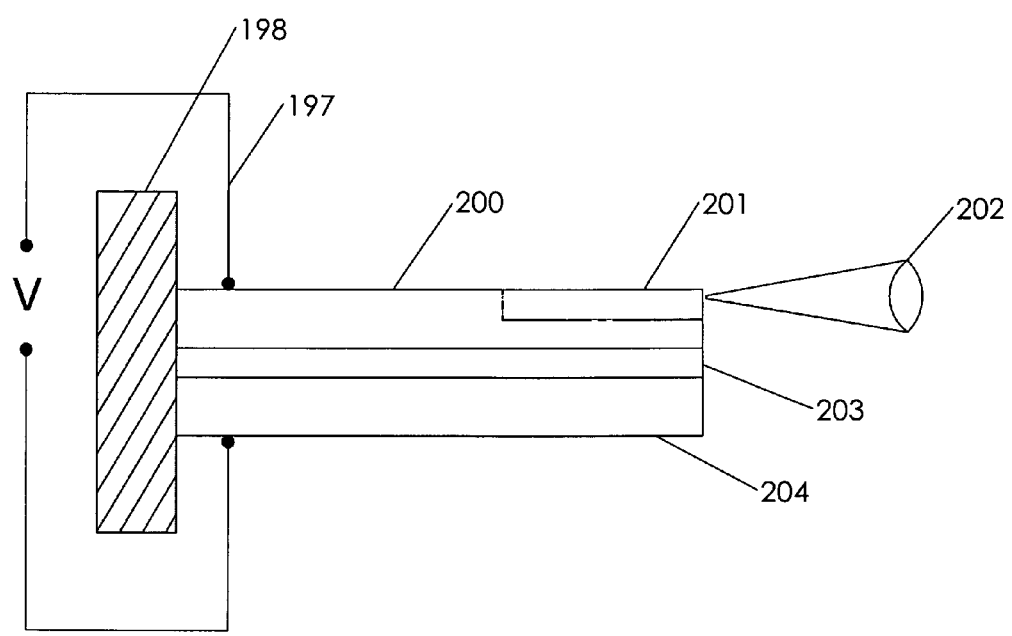
FIG. 38 depicts a bimorph formed by laminating two flexible freestanding epitaxial elements together with at least one active element formed on at least one of the flexible freestanding epitaxial elements of the present invention.
Figure 39:
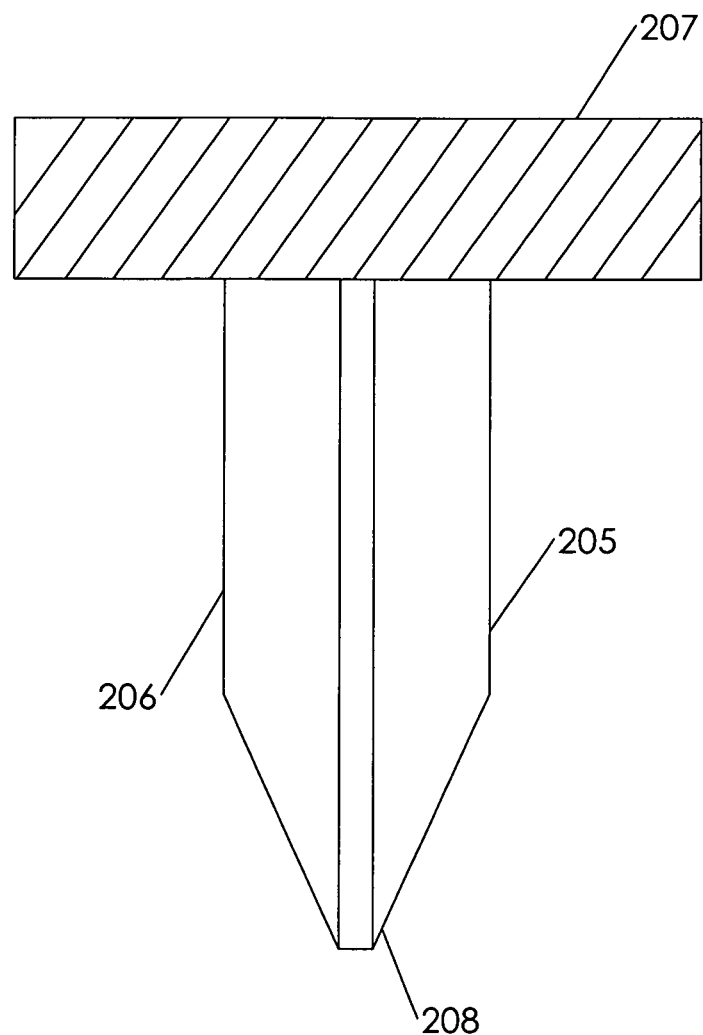
FIG. 39 depicts an ultrasonic scalpel formed using a bimorph containing at least one flexible freestanding epitaxial element of the present invention.

FIG. 38 depicts a bimorph with at least one active element 201. At least one flexible freestanding epitaxial element 200 containing one or more of the active elements 201 is bonded using bonding layer 203 and second layer 204 to form a movable active element. Interconnect 197 is used to actuate the bimorph and the use of additional interconnects can control the at least one active element 201. Support element 198 becomes the fixed reference point about which emitted radiation 202 moves. This approach can guide or redirect the emitted radiation 202. More preferably the use of this approach can form an optoelectronic switch. The ability to cleave the flexible freestanding epitaxial element 200 is an important aspect of this embodiment FIG. 39 depicts a cutting tool formed from at least one flexible freestanding epitaxial element 205 and 206. The replacement of one of the at least one flexible freestanding epitaxial element 205 or 206 with a hard sharpened element such as, but not limited to, diamond, metals, sapphire, or other materials that can take a suitable sharp edge 208 is an embodiment. Support 207 may be fixed or represent a handle for manual or machine based motion. The formation of a bimorph to move the cutting tool as discussed previously is an embodiment.

Figure 40:
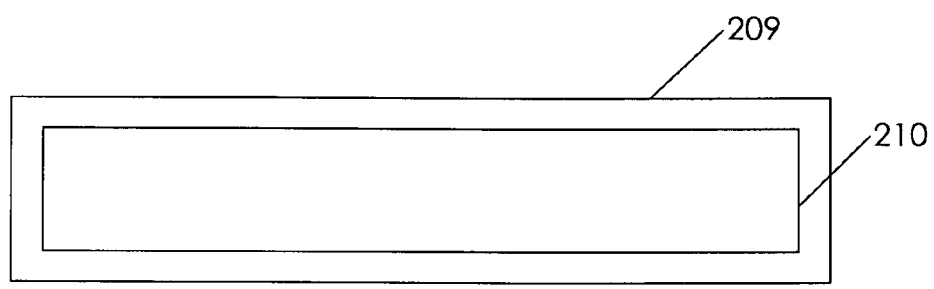
FIG. 40 depicts a flexible freestanding epitaxial element with chemically modified surfaces for enhanced adhesion of the present invention.

FIG. 40 depicts at least one flexible freestanding epitaxial element 210 in which chemical modification of the surface of the at least one flexible freestanding epitaxial element 210 forms a chemically modified surface 209. The modification being for the purpose of, but not limited to, improved adhesion, prevent adhesion, form a hydrophilic surface, form a hydrophobic surface, become protein selective, seed the surface for electroplating, or oxidize the surface. The use of masking methods as know in the art can create spatially defined regions of chemical modification.

Figure 41:
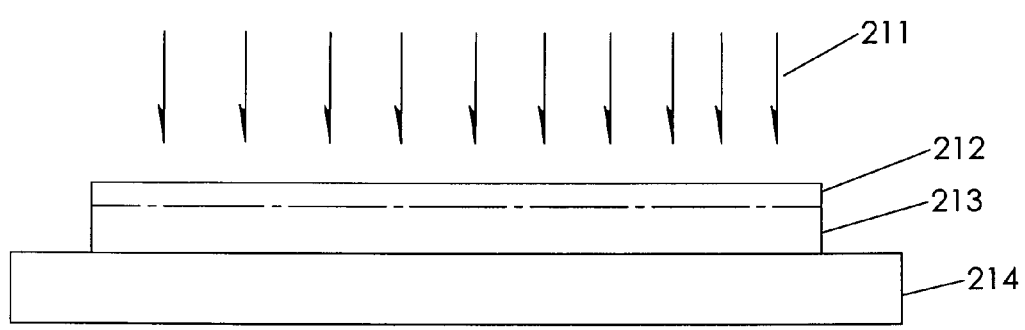
FIG. 41 depicts a flexible freestanding epitaxial element radiation annealed prior to separation of the present invention.

FIG. 41 depicts the use of radiation means 211 to modify the surface of at least one flexible freestanding epitaxial element 213 such that at least a portion 212 of at least one flexible freestanding epitaxial element 213 is exposed while attached to growth layer 214. The intent being the modification of the crystal structure of at least one flexible freestanding epitaxial element 213 to effect annealing, change in index, change in dopant concentration, and/or impart a charge in at least one flexible freestanding epitaxial element 213.

Figure 42:
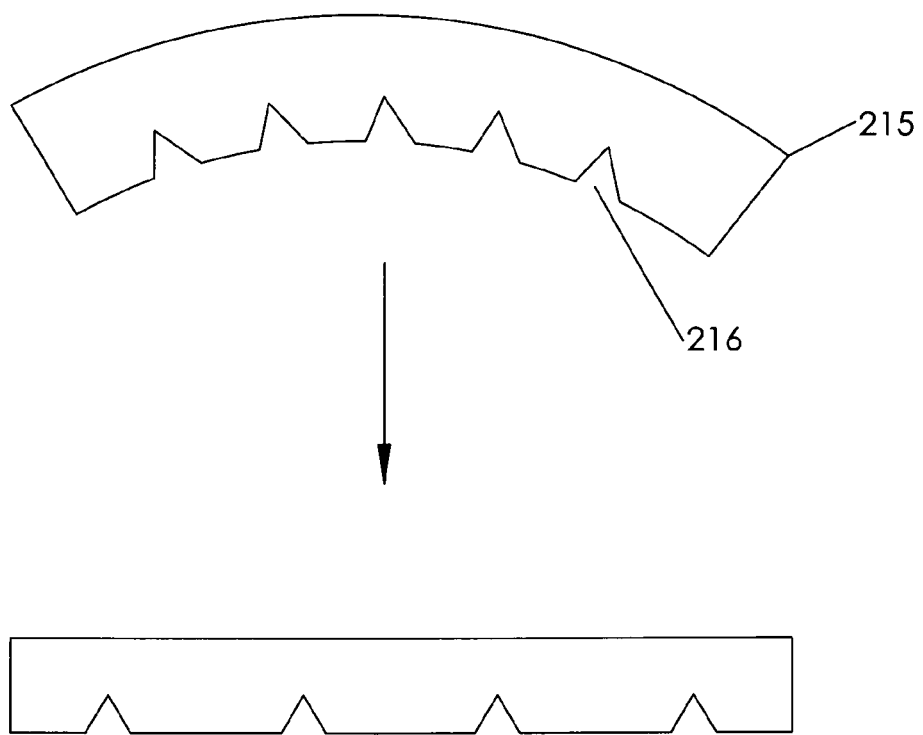
FIG. 42 depicts a flexible freestanding epitaxial element annealed after separation of the present invention.

FIG. 42 depicts a freestanding flexible freestanding epitaxial element 215 exhibiting bow. The process of annealing a freestanding flexible freestanding epitaxial element 215 can reduce bow. More preferably, the use of stress control features 216 in freestanding flexible freestanding epitaxial element 215 can further control bow along with annealing.

Figure 43:
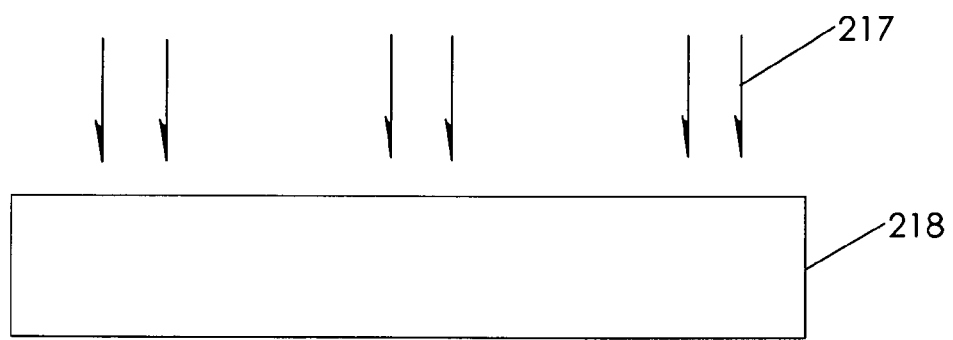
FIG. 43 depicts a flexible freestanding epitaxial element spatially modified using electron beam of the present invention.

FIG. 43 depicts the use of spatially defined irradiation 217 to locally modify the properties of flexible freestanding epitaxial element 218. The spatially defined irradiation 217 includes, but is not limited to, actinic radiation. The use of masking, sacrificial layers, and scanned radiation sources to form the pattern is an embodiment.

Figure 44:
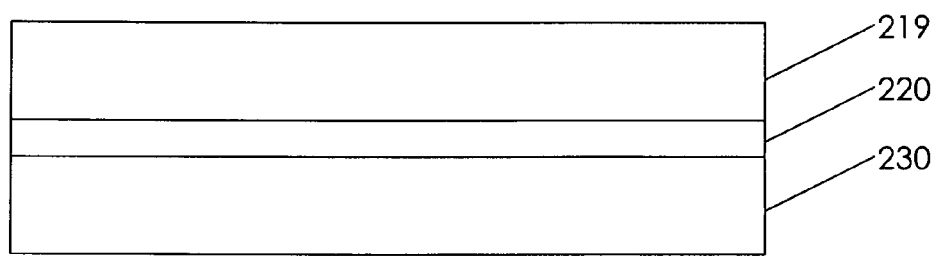
FIG. 44 depicts waferbonded LED to flexible freestanding epitaxial element of the present invention.

FIG. 44 depicts a LED in which at least one emitting structure 219 is bonded via bonding layer 220 to at least one flexible freestanding epitaxial element 230. The most preferred embodiment being that at least one emitting structure is a nitride LED. In this manner thermal expansion coefficients can be matched allowing for high temperature operation.

Figure 45:
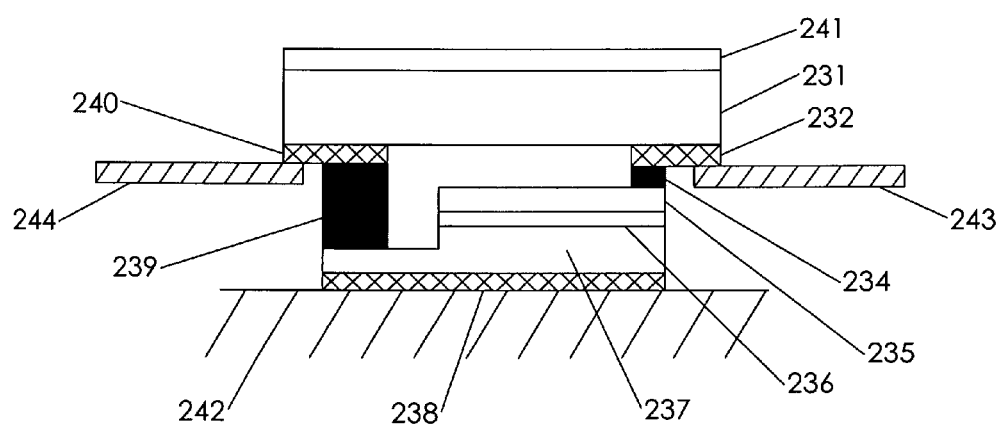
FIG. 45 depicts reverse flip chip mounted led on flexible freestanding epitaxial element of the present invention.

FIG. 45 depicts a reverse flip chip mounted LED. At least one flexible freestanding epitaxial element 231 containing contacts 232 and 240 to which LED contacts 234 and 239 are attached. LED contacts 239 and 234 are ohmically connected across LED containing p contact layer 235, active region 236 and n contact layer 237. The addition of a bond pad 238 provides thermal attachment to thermal cooling means 242. Electrical connections 243 and 244 attach to contacts 232 and 240 as well. Alternately wavelength conversion layer 241 may be, but not limited to, grown, attached, coated, and/or be a dopant within at least one flexible freestanding epitaxial element 230.

Figure 46:
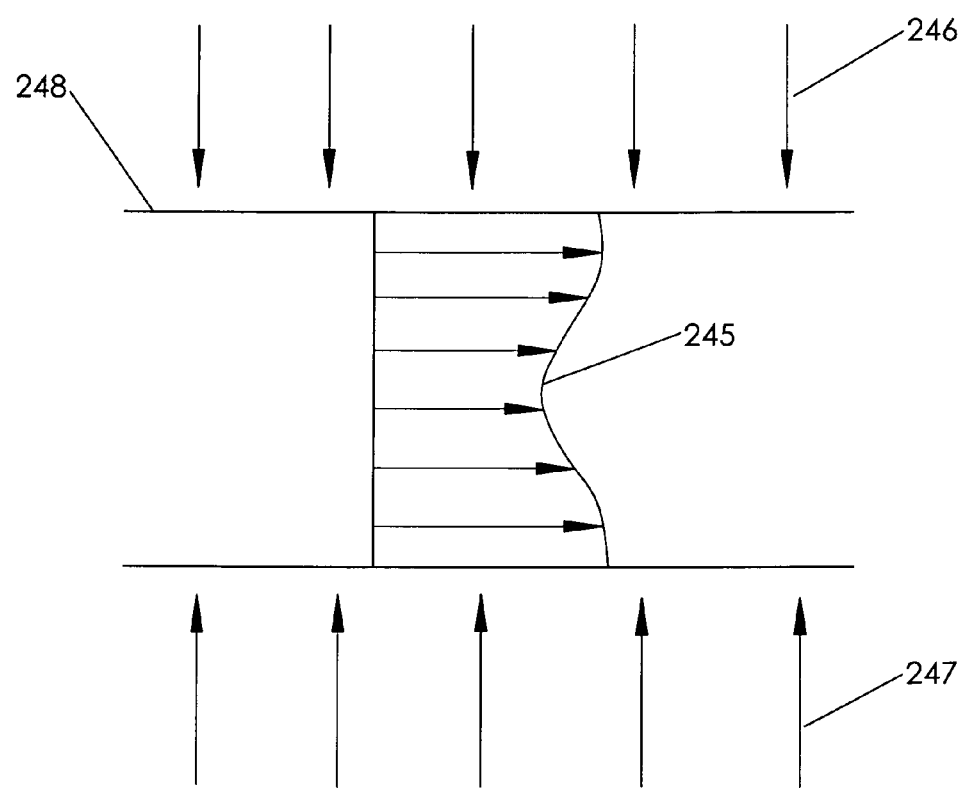
FIG. 46 depicts a nitride substrate with graded stress profiles formed by electron beam irradiation of the present invention.

FIG. 46 depicts a depth dependent property profile 245 within at least one flexible freestanding epitaxial element 248. The use of actinic radiation 246 and 247 from one or both sides of at least one flexible freestanding epitaxial element 248 is an embodiment of this radiation. More preferred is the use of electron beam radiation for actinic radiation 246 and/or 247 due to the ability to depth of penetration and flux levels. Even more preferred is electron beam irradiation with an energy between 1 and 50 Kev. The intent of this approach is to modify the surface region of the at least one flexible freestanding epitaxial element 248. The use controlled atmosphere and thermal heating can facilitate changes in material properties of at least one flexible freestanding epitaxial element 248.

Figure 47:
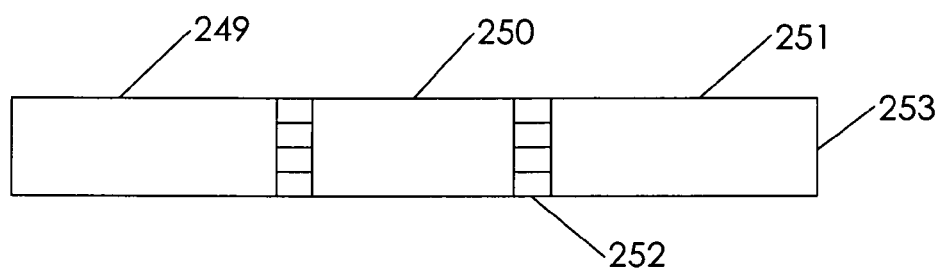
FIG. 47 depicts edge bonding of at least two flexible freestanding epitaxial elements of the present invention.

FIG. 47 depicts bonding of at least two flexible freestanding epitaxial elements 249, 250 and 251 substantially along their thinnest region 253 forming bond line 252. The use of, but not limited to, adhesives, glasses, evaporation, fusion bonding, wafer bonding can create bond line 252. Most preferably the cleaving of at least one face of at least two flexible freestanding epitaxial elements 249,250, and 251 and fusion bonding is an embodiment.

Figure 48:
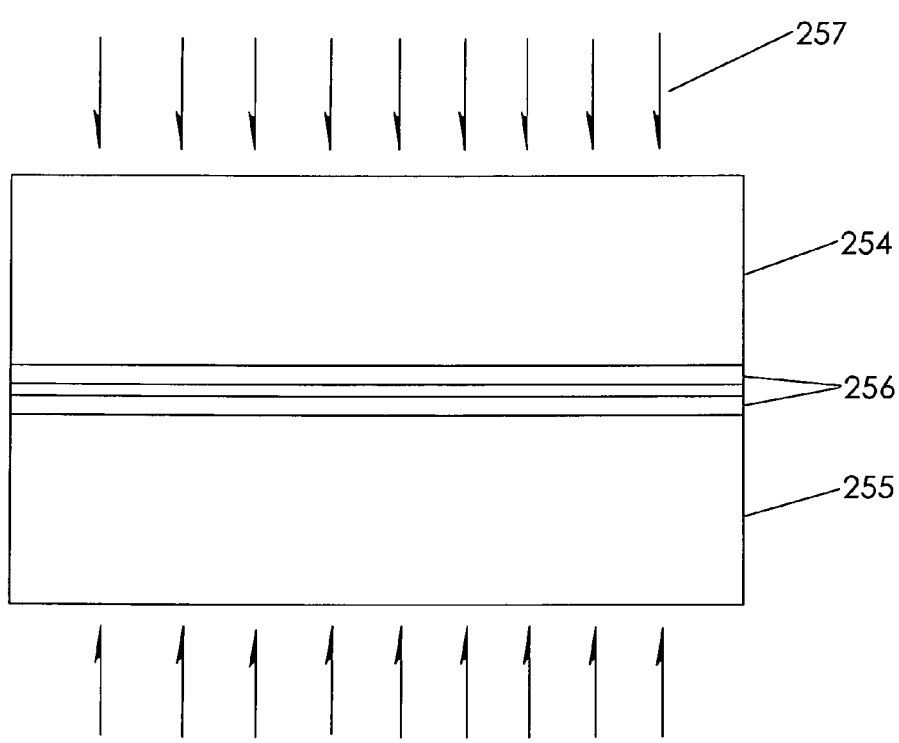
FIG. 48 depicts waferbonding of two flexible freestanding epitaxial elements of the present invention.

FIG. 48 depicts waferbonding of at least two flexible epitaxial elements 254 and 255 based on conversion of excess gallium 256 formed during separation into gallium oxide via heat, oxygen, and pressure 257. The formation of features on the inner surfaces of at least two flexible freestanding epitaxial elements 254 and 255 can allow for gas flow.

Figure 49:
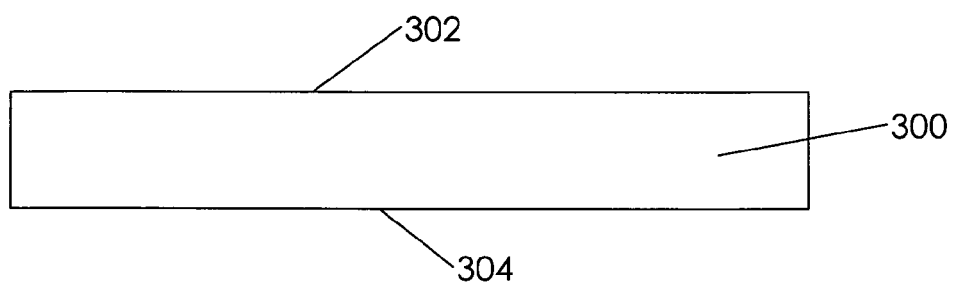
FIG. 49 depicts a flexible freestanding epitaxial element.

FIG. 49 depicts a flexible freestanding epitaxial element 300 of the present invention with an upper surface 302 of the flexible epitaxial element and a bottom surface 304 of the flexible epitaxial element. The lower surface 304 was in contact with the growth substrate (not shown) from which the flexible freestanding epitaxial element 300 was harvested as previously disclosed by Zimmerman. This method and alternate methods of separation of the flexible freestanding epitaxial element 300 from the growth substrate such that upper surface 302 is not touched, modified or grown on in order to form the flexible freestanding epitaxial element 300 are embodiments of this invention. In general, upper surface 302 is disclosed to be a virgin as grown epitaxy ready surface with an RMS surface roughness less than 100 nm RMS and even more preferably less than 10 nm RMS. The upper surface 302 has a substantially uniform crystal plane orientation across the majority of the flexible freestanding epitaxial element 300. In addition, flexible freestanding epitaxial element 300 is between 5 and 250 microns thick. Even more preferably the thickness is between 20 and 70 microns thick. This allows for the flexible freestanding epitaxial element 300 to flex to a radius of curvature less than 100 meters. Even more preferably the epitaxial element 300 can be flexed to a radius of curvature of less than 1 meter.

Both doped and undoped epitaxial elements 300 are disclosed. The upper surface 302 may be substantially polar, non-polar, or semi-polar crystal planes. Flexible freestanding epitaxial element 300 most preferably consists of a single crystal semiconductor material with a crystal size greater than 1 micron. Flexible freestanding epitaxial element 300 most preferably consists of a nitride alloy. Even more preferred, the flexible freestanding epitaxial element 300 consists of Si doped gallium nitride.

Flexible freestanding epitaxial element 300 may be doped, undoped, and semi-insulating Most preferred is a flexible freestanding epitaxial element 300 consisting of polar gallium nitride uniformly doped with Si. Doping concentrations between $10^{16}$ cm$^{-3}$ and $10^{20}$ cm$^{-3}$ are an embodiment of this invention. Most preferably epitaxial element 300 has a thickness between 20 and 70 microns to maintain reasonable flexibility while offering sufficient thickness to reduce defect density below $10^8$ cm$^2$ at upper surface 302 will maintaining a thermal time constant under 1 second.

Figure 50:
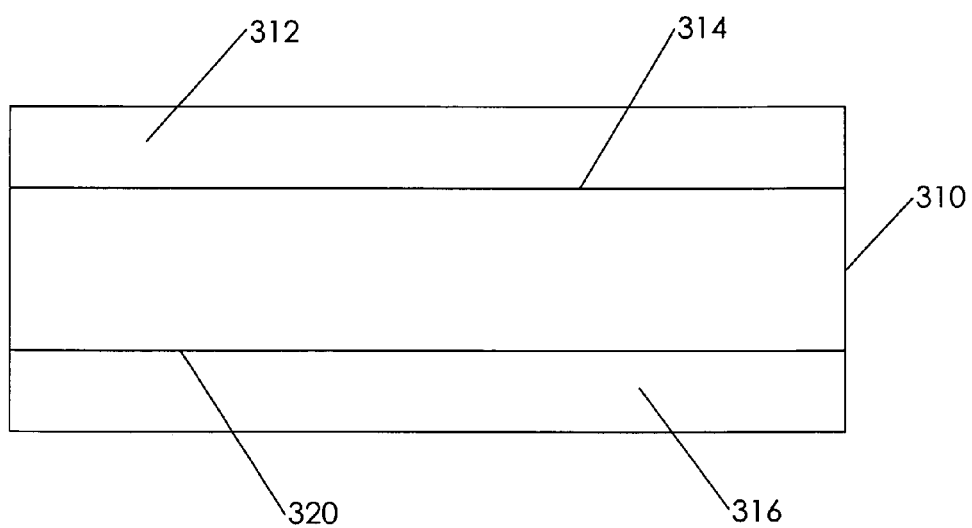
FIG. 50 depicts a epitaxial element with at least one additional growth layer on the upper or the lower surface of the epitaxial element.

FIG. 50 depicts an epitaxial element 310 with at least one additional growth layer 312 formed on the upper surface 314 of the epitaxial element 310 and optionally at least one additional growth layer 316 on the lower surface 320 of the epitaxial element 310. Most preferably the upper surface 314 as previously described in FIG. 49 is virgin epitaxy ready growth surface. This enables direct growth of active layers and inclusion of the epitaxial element 310 in the device design. Alternately, upper surface 314 may be used as a growth surface for at least one additional growth layer 312 to form thicker higher crystal quality layers on which the active portion of a device is grown.

Lower surface 320 and its associated at least one additional growth layer 316 may also be used within the device design. However, care must be taken of the surface quality of lower surface 320 which depends on the process used to harvest epitaxial element 310. Unlike the untouched virgin epitaxy ready growth surface 314 the lower surface 320 preferably is processed to minimize damage to its surface during the harvesting of the epitaxial element.

The flexible nature of epitaxial element 310 is used to compensate for lattice distortion and thereby allow for thicker growths and the growth of material with larger lattice mismatches. As an example, higher indium content InGaN can be grown on GaN epitaxial element 310 than is possible on GaN on sapphire templates, due to reduced stresses in epitaxial element 310.

The at least one additional growth layer 312 may be formed using MOCVD, HYPE, MBE, CVD, sputter, evaporative, spin coating and other deposition techniques as known in the art, on one or more of the surfaces of epitaxial element 310. The at least one additional growth layer 312 and 316 may consist of but not limited to oxides, nitrides, silicon, antimonides, metals, dielectrics and other semiconductor materials. Preferred is epitaxial growth of at least one additional growth layer 312 and 316 via MOCVD, HYPE, MBE, CVD or other deposition method on flexible freestanding epitaxial element 310. At least one additional growth layer 312 and 316 may be deposited separately or at the same time. At least one additional growth layer 312 and 316 may be uniform or structured, including multilayered, superlattices, quantum dots, or composites. A preferred embodiment of this invention is the epitaxial growth of at least one additional growth layers 312 and 316 on epitaxial element 310 for use in devices including but not limited to, LEDs, EELEDs, laser diodes, solar cells, photoelectrochemical cells, rf devices, and power devices. Multiple coating steps may be used to create the desired device structure.

As an example, on the upper surface 312 of an epitaxial element 310 additional growth layers 314 may be epitaxial grown via MOCVD consisting of at least one InGaN/GaN quantum well layer, followed by a p-doped AlGaN barrier layer, followed by a p-doped GaN layer, followed by an additional growth layer consisting of a TCO (transparent conductive oxide) consisting of but not limited to AZO, ITO, IZO, GIZO, GAZO, and other conductive oxides. In this example, at least one additional growth layer 316 may also be a TCO grown on the other lower surface 320 of epitaxial element 310.

Alternately, metal electrical contacts (not shown) may be added to the outer surfaces of one or both the additional growth layers 312 and 316 to enhance current spreading. In this manner a flexible freestanding epitaxial element based LED, solar cell, rf device, or power device can be formed without any additional support layers.

A preferred embodiment is a device in which the outer surfaces of at least one additional growth layers 312 and 316 consists of Al doped ZnO with an Al doping concentration greater than $10^{19}$ cm$^{-3}$ and a thickness greater than 3000 Angstroms grown via MOCVD on epitaxial element 310. The resulting TCO layers exhibit lower absorption losses, while maintaining high electrical conductivity, than amorphous, sputtered, or other non-epitaxially grown layers in thick layers. Layer thickness is critical for ESD and other considerations.

In another example, epitaxial element 310 can be used to grow a solar cell. The epitaxial element 310 can be a high bandgap material including but not limited to nitrides, carbides, oxides, and diamond. Higher bandgap materials typically require higher growth temperatures and therefore the sequence of device fabrication becomes critical. It is preferred that high bandgap at least one additional growth layers 312 and 316 are grown first on epitaxial element 310 followed by low bandgap material at least one additional growth layers 312 and 316. Because the epitaxial element 310 is freestanding and additionally both upper surface 314 and lower surface 320 can be used in the device structure, high band gap materials can be used as growth elements for low bandgap materials and then the device is simply turned over such that the incident solar photons enters through the high bandgap materials and its associated junctions first.

As an example, at least one additional layer 312 is an InGaN/GaN solar cell junction which is grown via MBE on the upper surface 314 of epitaxial element 310 which is Si doped GaN. This is followed by a low bandgap junction on either the outer surface of the at least one additional layer 312 or on the lower surface 320 of epitaxial element 310. Depending on the surface used to deposit the low bandgap junction incident solar radiation will either enter the device from the top or bottom outer surfaces of the device. The low bandgap junctions may consist of but not limited to AZO or other transparent conductive oxide, Si, Ge, or other low bandgap solar cell junction materials known in the art.

As stated earlier the flexible nature of the epitaxial element 310 allows for high quality growth of materials with large lattice mismatches. Using the process of this invention thin, flexible, high efficiency solar cells can be created using epitaxial elements 310. Epitaxial element 310 may be n-doped, p-doped, semi-insulating, and undoped. Typical dopants include but are not limited to Si, Fe, Mg, and Zn. These dopants may be uniformly, stepwised or gradiently doped.

The use of hot wall MOCVD such that a uniform epitaxially grown layer is formed on all surfaces of epitaxial element 310 is an embodiment of this invention.

The removal of the overcoated edges via mechanical, chemical, laser, and other etching means to isolate at least one additional growth layer 312 and 316 is an embodiment of this invention. More preferred is the partial scribing of the epitaxial element 310 and/or additional layers 312 and 316 via laser scribing. This permits the finished growth to be separated into smaller device chips using a cleaving process, which provides a clean edge to the nitride chip. This eliminates shorting of the devices due to contaminants created during the laser process coating the edges of the chips.

As an example, a typical MQW LED structure would consist of Si doped Gallium nitride, with 5 periods of InGaN and GaN layers to define the multiple quantum wells with thickness ranging from tens to hundreds of angstroms, followed by AlGaN barrier a few 100 Angstroms thick, followed by a Mg doped GaN up to a few 1000 Angstroms thick. All these layers induce stresses and can induce bowing of the overall wafer. The thinnest of the at least one additional layers 312 and 316 in this case require that either very low growth rates are used or very quick changes in process conditions are required. As such epitaxial element 310 with a thermal time constant less than 1 second is preferred as is direct heating of the epitaxial element 310 during the growth of at least one additional growth layers 312 and 316.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

The invention claimed is:

1. An epitaxial element capable of being formed into a semiconductor comprising a freestanding thin flexible foil, said thin flexible foil having at least one virgin growth surface suitable and ready for epitaxial growth of at least one growth layer.

2. The epitaxial element of claim 1 wherein said virgin growth surface does not require any surface preparation prior to epitaxial growth processing.

3. The epitaxial element of claim 1 wherein the heat capacity of the device is low enough to enable a 1 second or less thermal time constant during epitaxial growth or doping of the epitaxial element.

4. The epitaxial element of claim 1 wherein said epitaxial element can be flexed with a radius of curvature less than 100 meters.

5. The epitaxial element of claim 1 wherein said epitaxial element can be flexed with a radius of curvature less than 1 meter.

6. The epitaxial element of claim 1 wherein said epitaxial element is a nitride, zinc oxide, or one of their alloys with a thickness between 3 and 250 microns.

7. The epitaxial element of claim 1 wherein said epitaxial element is between 20 and 70 microns thick, and said at least one epitaxial element is gallium nitride uniformly doped with silicon, said silicon doping concentration being between $10^{16}$ cm$^{-3}$ and $10^{20}$ cm$^{-3}$.

8. The epitaxial element of claim 1 wherein at least one additional growth layer is formed on said epitaxial element.

9. The epitaxial element of claim 8 wherein said at least one additional growth layer comprises at least one of the following materials: an oxide, a nitride, an arsenide, silicon, an antimonide, a metal, a dielectric, gallates, aluminates, carbides or alloys of said materials.

10. The epitaxial element of claim 9 wherein said at least one additional growth layer comprises multiple growth layers and wherein said multiple growth layers include at least one of the following device layers: an indium gallium nitride/gallium nitride quantum well, a p doped aluminum gallium nitride barrier layer, a p doped gallium nitride layer, and an electrical contact layer; to form a flexible semiconductor device, such as a light emitting diode, a solar cell, a RF device, or a power device.

11. The epitaxial element of claim 1 wherein said at least one epitaxial element is used as a growth substrate for at least one low bandgap device.

12. The epitaxial element of claim 1 wherein at least one aluminum gallium nitride buffer layer is formed on the at least one virgin growth surface of said epitaxial element.

13. The epitaxial element of claim 1 wherein said epitaxial element further comprises at least one outer layer of a transparent conductive oxide.

14. The epitaxial element of claim 13 wherein said transparent conductive oxide layer of said at least one outer layer is a degenerative doped zinc oxide alloy with dopant concentration greater than $10^{18}$ cm$^{-3}$ and with a thickness greater than 5000 angstroms.

15. The epitaxial element of claim 1 wherein said epitaxial element is a n type contact layer for said semiconductor.

16. An epitaxial element of with at least one as grown epitaxy ready surface and a substantially uniform crystal plane orientation across said as grown epitaxy ready surface
    wherein at least one additional growth layer is formed on said at least one as grown epitaxy ready growth surface within a reactor wherein said epitaxial element is substantially heated to growth temperature by actinic radiation absorbed by said epitaxial element.

17. The epitaxial element of claim 16 wherein said at least one additional growth layer comprises multiple growth layers formed on said at least one as grown epitaxy ready growth surface.

18. The epitaxial element of claim 17 wherein said multiple layers are formed into at least one flexible semiconductor device comprising at least one of the following devices; a solar cell, a multi-junction solar cell, a RF device, a power device, a piezoelectric device, an LED, a laser diode, an EELED, a biomedical device, or 3D semiconductor devices.

19. An epitaxial element capable of being formed into a semiconductor in the form of a freestanding thin flexible foil, made by the steps of: growing a layer of the epitaxial element on a suitable substrate; separating said epitaxial element from the substrate utilizing a laser liftoff process thereby producing an epitaxial element in the form of a thin flexible foil having at least one virgin growth surface suitable and ready for epitaxial growth.

20. The epitaxial element of claim 19 wherein the step of growing a layer of the epitaxial element on a suitable substrate is performed by hybrid vapor phase epitaxy.

21. The epitaxial element of claim 20 wherein the laser lift off process comprises focusing a laser through said substrate onto the junction of the substrate and the epitaxial element and thereby separating the epitaxial element from the substrate without penetrating the virgin growth surface of the epitaxial element.

22. An epitaxial element comprising at least one epitaxial element wherein said epitaxial element has a top surface and bottom surface, either of which can be used as growth surfaces for additional growth layers to be formed.

23. The epitaxial element of claim 22 wherein either said top surface or said bottom surface of said epitaxial element is the growth surface for at least one solar cell.

24. The epitaxial element of claim 22 wherein either said top surface or said bottom surface of said epitaxial element is used as a regrowth surface for at least one additional growth layer with a lower dislocation defect density than said epitaxial element.

* * * * *